(12) United States Patent
Davy et al.

(10) Patent No.: US 12,490,572 B2
(45) Date of Patent: Dec. 2, 2025

(54) SUPPLEMENTING THE POWER GENERATION OF VISIBLY TRANSPARENT SOLAR ENERGY HARVESTING DEVICES COMPRISING ORGANIC SEMICONDUCTORS

(71) Applicant: Andluca Technologies Inc., Princeton, NJ (US)

(72) Inventors: Nicholas C. Davy, Philadelphia, PA (US); Jason U. Wallace, Rochester, NY (US)

(73) Assignee: Andluca Technologies Inc., Rochester, NY (US)

( * ) Notice: Subject to any disclaimer, the term of this patent is extended or adjusted under 35 U.S.C. 154(b) by 185 days.

(21) Appl. No.: 18/123,792

(22) Filed: Mar. 20, 2023

(65) Prior Publication Data
US 2024/0324254 A1    Sep. 26, 2024

(51) Int. Cl.
*H10K 30/50*     (2023.01)
*H10F 77/20*     (2025.01)
(Continued)

(52) U.S. Cl.
CPC ........... *H10K 30/50* (2023.02); *H10F 77/247* (2025.01); *H10F 77/251* (2025.01);
(Continued)

(58) Field of Classification Search
CPC ........ H10K 30/50; H10K 71/60; H10K 30/20; H10K 85/625; H10K 30/82
See application file for complete search history.

(56) References Cited

U.S. PATENT DOCUMENTS 6,476,312 B1    11/2002   Barnham
9,331,298 B2     5/2016   Lunt et al.
(Continued)

FOREIGN PATENT DOCUMENTS

WO    2012/107701 A1    8/2012
WO    2015/023574 A1    2/2015
(Continued)

OTHER PUBLICATIONS

Sark et al., "Luminescent Solar Concentrators—a low cost photovoltaics alternative", EPJ Web of Conferences 33, 02003 (2012). (Year: 2012).*
(Continued)

*Primary Examiner* — Tae-Sik Kang
(74) *Attorney, Agent, or Firm* — Nutter McClennen & Fish LLP

(57) ABSTRACT

Illustrative embodiments of the invention generally relate to photovoltaics and solar energy harvesting devices and, particularly, to those that are transparent or semi-transparent, allowing sufficient visible light through them to allow visualization of objects through them, and more particularly, to those that supplement their primary near ultraviolet light absorption with secondary and/or tertiary absorptions of narrow bands of visible light while maintaining their transparency. Various embodiments of the invention relate to single solar materials with both primary ultraviolet absorption and secondary, narrow-band visible absorption, while some embodiments of the invention utilize mixtures of one or more materials to realize a primary ultraviolet absorption of light with secondary, or even tertiary, narrow bands of visible light absorption. Means of manufacturing such photovoltaics and solar energy harvesting devices will also be disclosed as well as the applications and uses thereof.

17 Claims, 24 Drawing Sheets

(51) Int. Cl.
*H10K 30/20* (2023.01)
*H10K 30/82* (2023.01)
*H10K 71/60* (2023.01)
*H10K 85/60* (2023.01)
*H10K 102/10* (2023.01)

(52) U.S. Cl.
CPC ........... *H10F 77/254* (2025.01); *H10K 30/20* (2023.02); *H10K 30/82* (2023.02); *H10K 71/60* (2023.02); *H10K 85/625* (2023.02); *H10K 2102/103* (2023.02)

(56) References Cited

U.S. PATENT DOCUMENTS

| | | |
|---|---|---|
| 9,502,182 B2 | 11/2016 | Jung et al. |
| 9,853,172 B2 | 12/2017 | Gila et al. |
| 9,985,158 B2 | 5/2018 | Lunt et al. |
| 10,439,090 B2 | 10/2019 | Lunt et al. |
| 10,476,018 B2 | 11/2019 | Loo et al. |
| 10,510,914 B2 | 12/2019 | Lunt, III et al. |
| 10,809,588 B2 | 10/2020 | Yu et al. |
| 2007/0111027 A1 | 5/2007 | Chen et al. |
| 2008/0149165 A1 | 6/2008 | Hoeks et al. |
| 2009/0235974 A1 | 9/2009 | Mapel et al. |
| 2011/0240120 A1 | 10/2011 | Ronda et al. |
| 2012/0132278 A1 | 5/2012 | Winston et al. |
| 2013/0213472 A1 | 8/2013 | Powell et al. |
| 2014/0130864 A1 | 5/2014 | Lunt et al. |
| 2014/0311572 A1 | 10/2014 | De Boer et al. |
| 2015/0194555 A1 | 7/2015 | Zhang et al. |
| 2017/0317305 A1 | 11/2017 | Hammond et al. |
| 2017/0341346 A1 | 11/2017 | McDaniel et al. |
| 2017/0359016 A1 | 12/2017 | Kim et al. |
| 2019/0190438 A1 | 6/2019 | Hack et al. |
| 2019/0284471 A1 | 9/2019 | Gu et al. |
| 2020/0098942 A1 | 3/2020 | Lunt, III et al. |
| 2020/0144960 A1* | 5/2020 | Davy ..................... H02S 30/10 |
| 2020/0235254 A1 | 7/2020 | Zhou et al. |
| 2020/0395885 A1 | 12/2020 | Janowski |
| 2021/0050538 A1* | 2/2021 | Pandey .................. H10K 30/85 |
| 2023/0033629 A1 | 2/2023 | Lunt, III et al. |
| 2023/0208346 A1 | 6/2023 | Davy |
| 2023/0231508 A1 | 7/2023 | Davy et al. |
| 2024/0324257 A1 | 9/2024 | Davy et al. |

FOREIGN PATENT DOCUMENTS

| | | |
|---|---|---|
| WO | 2019/202529 A1 | 10/2019 |
| WO | 2019/217583 A1 | 11/2019 |
| WO | 2020/068670 A1 | 4/2020 |

OTHER PUBLICATIONS

Davy et al., "Pairing of near-ultraviolet solar cells with electrochromic windows for smart management of the solar spectrum", Nature Energy, 2, All Pages, 30JU N2017. (Year: 2017).

International Search Report and Written Opinion for International Application No. PCT/US2024/012129 mailed Jun. 5, 2024 (14 pages) [121714-10102].

Mazzaro et al., "The Renaissance of Luminescent Solar Concentrators: The Role of Inorganic Nanomaterials", Adv. Energy Mater. 2018, 8, 1801930 (Year: 2018).

Zhang et al. "Introducing Identical Benzodithiophene Donor Unit for Polymer Donor and Small-molecule Acceptor to Unveil the Relationship of Molecule Structure and Photovoltaic Performance of Non-Fullerene Organic Solar Cells", Journal of Materials Chemistry A, 2019.

* cited by examiner

Tetrabenzofuranyldibenzocoronene with four-fold derivatization at the benzofuran 5-position with 2-methoxyethoxy substituents ("MOEO-TBF").

Tetrabenzofuranyldibenzocoronene with four-fold derivatization at the benzofuran 5-position with nonyloxy substituents.

1110

1120

1200

1700

Provide a rigid transparent panel including a transparent film — 1710

| Provide at least one photosensitive layer having a first absorption peak between and including 350 nm and 420 nm and a second absorption peak between and including 420 nm and 780 nm | 1810 |

| Provide an anode configured to be in electrical communication with a first surface of the at least one photosensitive layer | 1820 |

| Provide a cathode configured to be in electrical communication with a second surface of the at least one photosensitive layer | 1830 |

SUPPLEMENTING THE POWER GENERATION OF VISIBLY TRANSPARENT SOLAR ENERGY HARVESTING DEVICES COMPRISING ORGANIC SEMICONDUCTORS

GOVERNMENT RIGHTS

This invention was made with government support under 2112279 awarded by the National Science Foundation. The government has certain rights in the invention.

FIELD

Illustrative embodiments of the invention generally relate to photovoltaics and solar energy harvesting devices and, more particularly, various embodiments of the invention relate to using ultraviolet solar materials in conjunction with narrow band visible solar materials.

BACKGROUND

Optoelectronic devices using organic materials are increasingly desirable in a variety of applications for a number of reasons. Materials used to construct organic optoelectronic devices are relatively inexpensive in comparison to their inorganic counterparts, thereby providing cost advantages over optoelectronic devices produced with inorganic materials. Moreover, organic materials provide desirable physical properties, such as flexibility, permitting their use in applications unsuitable for rigid materials. Examples of organic optoelectronic devices comprise organic photovoltaic cells, organic light emitting devices (OLEDs), and organic photodetectors.

SUMMARY OF VARIOUS EMBODIMENTS

In accordance with one embodiment of the invention, a transparent solar energy harvesting device includes one or more luminophores distributed in or on a transparent substrate. The one or more luminophores absorb light in the UV region and the visible region, and the one or more luminophores emit visible light in the visible region.

In one embodiment, a visibly transparent luminescent solar concentrator (LSC) includes one or more luminophores in or on a transparent substrate. The one or more luminophores are configured to absorb light in the ultraviolet (UV) region and the visible region. The one or more luminophores are configured to use the absorbed light in the UV region and the visible region to emit visible light in the visible region.

The visibly transparent LSC also includes one or more photovoltaic cells configured to absorb the visible light emitted by the one or more luminophores and absorb solar radiation. The absorption of the visible light and the solar radiation by the one or more photovoltaic cells generates energy. The visibly transparent LSC has an average visible transmission (AVT) of between 35% and 95% of incident light having wavelengths of between 400 nm and 780 nm, and the values of the CIE L*a*b* color coordinates a* and b* of the transmitted visible light are each between negative 30 and positive 30.

In some embodiments, a first luminophore of the one or more luminophores may have a first absorption peak in the UV region at wavelengths between about 315 nm and 420 nm. In addition, a second luminophore of the one or more luminophores may have a second absorption peak in the visible region at wavelengths between about 420 nm and 780 nm, and a wavelength band with a full width half maximum (FWHM) of between from about 10 nm to about 50 nm. At least one of the one or more luminophores may have a strongest emission of light in the visible region at wavelengths between about 420 nm and 780 nm.

In some embodiments, the visibly transparent LSC the one or more luminophores may be organic materials. Further, the at least one of the one or more luminophores may include coronenes, substituted coronene-based materials, coumarins, naphthalimides, anthracenes, rubrenes, thiophenes, fluorenes, diazafluorenes, fluorenones, dicyanomethylenes, rhodamines, perylenebisimides, and bipyridines. The substituted coronene-based materials may include at least one of a hexabenzocoronene derivative, a tetrabenzofuranyldibenzocoronene derivative, or a tetrabenzothiophenyldibenzocoronene derivative.

In some embodiments, the one or more photovoltaic cells may be coupled to edges and/or side surfaces of the transparent substrate. The visibly transparent may include a transparent waveguide adjacent to a transparent window material. The transparent waveguide may include at least one of glass, quartz, polymethyl methacrylate (PMMA), polyvinyl butyral (PVB), polyacrylates, polyalkylacrylates, polycarbonates, polyethylene terephthalate, ionoplast polymer, ethylene vinyl acetate copolymer (EVA), polyamideimide, or polyvinylidene fluoride.

In some embodiments, the one or more luminophores may be dispersed in the transparent waveguide. The transparent waveguide containing the dispersed one or more luminophores may include a transparent film, a hard coating, or a plurality of film layers. The transparent waveguide may be sandwiched between two rigid plates of glass, plexiglass, or other polymer, in any combination.

In some embodiments, the transparent film, the hard coating, or the plurality of film layers may be deposited on the transparent window material by thermal evaporation, solution-processing, melt-processing, organic vapor phase deposition, organic vapor jet printing, solid mixing, or crosslinking of liquid films. Further, the transparent window material may include at least one plastic, poly(methyl methacrylate) (PMMA), poly-(ethylmethacrylate) (PEMA), or (poly)-butyl methacrylate-co-methyl methacrylate (PBMMA).glass, plexiglass, PMMA, plastic sheet, or other transparent material. In addition, the transparent film, hard coating, or plurality of film layers may include cellulose acetate butyrate, acrylic, acrylate-on-glass, ionoplast polymer, acetate, polyvinyl butyral, polyurethane, or thermoplastic polyurethane.

In some embodiments, the visibly transparent LSC may further include at least one dopant distributed in the transparent substrate. The at least one dopant may be configured to provide improved color coordinates and color neutrality of the light transmitted through the LSC. The at least one dopant may be configured to provide improved color coordinates and color neutrality of the light transmitted through the LSC and any assembly in which the LSC is incorporated.

In another embodiment, a visibly transparent luminescent solar concentrator (LSC) includes a visibly transparent waveguide, at least one solar photovoltaic cell, and at least one luminophore material embedded in the visibly transparent waveguide. The at least one luminophore material is configured to absorb light in the ultraviolet (UV) region and the visible region. In addition, the at least one luminophore material is configured to use the absorbed light in the UV region and the visible region to emit visible light in the visible region.

The visibly transparent LSC has an average visible transmission (AVT) of between 35% and 95% of incident light having wavelengths of between 400 nm and 780 nm; and the absolute values of the CIE L*a*b* color coordinates a* and b* of the transmitted visible light are each between −30 and 30.

Further, the at least one solar photovoltaic cell is configured to absorb the visible light emitted from the at least one visibly transparent luminophores and solar radiation, such that the at least one solar photovoltaic cell generates electrical energy.

In some embodiments, the luminophore material may include a single luminophore material. The single luminophore material may include a substituted coronene-based material.

In some embodiments, the at least one luminophore material comprises two or more luminophore materials. The two or more luminophore materials may include at least two or more luminophores including coronenes, substituted coronene-based materials, coumarins, naphthalimides, anthracenes, rubrenes, thiophenes, fluorenes, diazafluorenes, fluorenones, dicyanomethylenes, rhodamines, perylenebisimides, or bipyridines.

In some embodiments, the LSC further includes one or more electrical circuits in electrical communication with the at least one solar photovoltaic cell. The LSC may further include one or more electrical components selected from the group consisting of light sensors, color sensors, humidity sensors, temperature sensors, occupancy sensors, motion sensors, cellular signal amplifiers, universal serial bus interfaces, energy storage devices, or wireless communication elements in electrical communication with the one or more electrical circuits. The one or more electrical components may be powered by the at least one solar photovoltaic cell.

In some embodiments, the at least one solar photovoltaic cell may be coupled to at least one side surface or edge of the visibly transparent waveguide. The at least one solar photovoltaic cell may be a first at least one solar photovoltaic cell. The LSC may further include a second at least one solar photovoltaic cell coupled to at least one of a top or a bottom surface of the LSC. The at least one of the top or the bottom surface of the LSC may be perpendicular to the at least one side surface or edge of the visibly transparent waveguide. The second at least one solar photovoltaic cell may be visibly transparent. In addition; the at least one solar photovoltaic cell may be coupled to the LSC to forms a combined visibly transparent LSC/PV device.

In some embodiments, the combined visibly transparent LSC/PV device may have an average visible transmission (AVT) of between 35% and 95% of incident light having wavelengths of between 400 nm and 780 nm. The values of the CIE L*a*b* color coordinates a* and b* of the transmitted visible light through the combined visibly transparent LSC/PV device may each be between negative 30 and positive 30.

In some embodiments, the first at least one solar photovoltaic cell may generate a first electrical energy in electrical communication with a first electrical circuit; and the second at least one solar photovoltaic cell may generate a second electrical energy in electrical communication with a second electrical circuit.

In yet another embodiment, a method of making a visibly transparent luminescent solar collector (LSC) includes providing one or more luminophores distributed in a transparent substrate and optically coupling one or more photovoltaic cells with the transparent substrate. The one or more luminophores are configured to absorb light in the ultraviolet (UV) region and the visible region, and the one or more luminophores are configured to use the absorbed light in the UV region and the visible region to emit visible light in the visible region. The one or more photovoltaic cells are configured to absorb the visible light emitted by the one or more luminophores and absorb solar radiation. The absorption of the visible light and the solar radiation by the one or more photovoltaic cells generates energy. The visibly transparent LSC has an average visible transmission (AVT) of between 35% and 95% of incident light having wavelengths of between 400 nm and 780 nm; and the absolute values of the CIE L*a*b* color coordinates a and b* of the transmitted visible light are each between −30 and 30.

In some embodiments, the providing one or more luminophores distributed in a transparent substrate may include dispersing the one or more luminophores in a transparent waveguide material. Providing one or more luminophores distributed in a transparent substrate may also include forming the transparent waveguide material with the one or more luminophores into a transparent waveguide; and may also include adhering the transparent waveguide with the one or more luminophores to a transparent window material. The transparent waveguide with the one or more luminophores may include a transparent film, a hard coating, or a plurality of film layers.

The adhering the transparent waveguide with the one or more luminophores to the transparent window material may also include depositing the transparent waveguide material with the one or more luminophores to the transparent window material by thermal evaporation, solution-processing, melt-processing, organic vapor phase deposition, organic vapor jet printing, solid mixing, or crosslinking of liquid films.

In yet another embodiment, a visibly transparent photovoltaic device, includes at least one photosensitive layer having a first absorption peak between and including 315 nm and 420 nm and a second absorption peak between and including 420 nm and 780 nm, and anode, and a cathode. The anode is configured to be in electrical communication with a first surface of the at least one photosensitive layer. The cathode is configured to be in electrical communication with a second surface of the at least one photosensitive layer. The visibly transparent photovoltaic device has an average visible transmission (AVT) of between 35% and 95% of incident light having wavelengths of between 400 nm and 780 nm. The values of the CIE L*a*b* color coordinates a* and b* of the transmitted visible light are each between negative 30 and positive 30. The visibly transparent photovoltaic device generates electrical power. In some embodiments, the second absorption peak has a full-width half-maximum of between 10 nm and 75 nm.

In some embodiments, the anode and the cathode may independently include one or more of LiF/Al, Au, Ag, a transparent conducting oxide, a transparent conducting graphene thin film, a transparent conducting nanotube film, a transparent ultrathin metal, a metal, or metal nanowires.

In some embodiments, the transparent conducting oxide may include indium tin oxide (ITO), aluminum doped zinc oxide (AZO), zinc oxide, or gallium zinc oxide (GZO), the transparent ultrathin metal may include Al, Au, Ag, Mo, or Ni, the metal may include Al, Au, Ag, Ni, Cu, or Mo; and the metal nanowire may include Al, Au, or Ag.

In some embodiments, the at least one photosensitive layer may include an organic electron donor and an organic electron acceptor. The photovoltaic device my include a single junction architecture generating an open circuit voltage (Voc) of at least 1.4 V.

In some embodiments, the at least one photosensitive layer may include a first photosensitive layer comprising an organic electron donor; and may include a second photosensitive layer comprising an organic electron acceptor. Further, the first photosensitive layer and the second photosensitive layer may form in a bilayer, planar heterojunction.

In some embodiments, the first photosensitive layer may have the first absorption peak between 315 nm and 420 nm, and the second photosensitive layer may have the second absorption peak between 420 nm and 780 nm.

In some embodiments, the first photosensitive layer may have the second absorption peak between 420 nm and 780 nm, and the second photosensitive layer may have the first absorption peak between 315 nm and 420 nm.

In some embodiments, the organic electron donor and/or the organic electron acceptor may include dibenzocoronene derivatives. The organic electron donor may include a first contorted hexabenzocoronene (cHBC) or cHBC derivative. The electron acceptor may include a second cHBC or cHBC derivative.

In some embodiments, the second absorption peak between 420 nm and 780 nm may be due to dopants dispersed in the at least one photosensitive layer. The dopants may include one or more of: coumarins; naphthalimides; coronenes; anthracenes; rubrenes; thiophenes; fluorenes; diazafluorenes; fluorenones; dicyanomethylenes; rhodamines, perylenebisimides; or bipyridines.

In some embodiments, the organic electron donor and the organic electron acceptor may include at least one of a tetrabenzothiophenyldibenzocoronene derivative or a tetrabenzofuranyldibenzocoronene derivative.

In some embodiments, the photovoltaic device may further includes one or more electrical components selected from the group consisting of light sensors, color sensors, humidity sensors, temperature sensors, occupancy sensors, motion sensors, cellular signal amplifiers, universal serial bus interfaces, energy storage devices, and wireless communication elements. The one or more electrical components may be electrically powered by the photovoltaic device.

In some embodiments, the presence of the second peak absorption in the visible portion of the solar spectrum may provide supplemental electrical power to the photovoltaic device to supplement the electrical power produced by the first peak absorption in the UV portion of the solar spectrum while maintaining the AVT above 35% and maintaining the values of the CIE L*a*b* color coordinates being each between negative 30 and positive 30.

In some embodiments, the photovoltaic device may further include a transparent luminescent solar concentrator (LSC) coupled to the visibly transparent photovoltaic device. The transparent LSC may be coupled to the anode or the cathode of the photovoltaic device.

In yet another embodiment, a window includes a rigid transparent panel including a transparent film. The transparent film includes a plurality of luminophores, and the plurality of luminophores are operable to have a first peak absorbance of light in the ultraviolet (UV) spectrum and a peak emission of light in the visible spectrum. The window has an average visible transmission (AVT) of between 35% and 95% of incident light having wavelengths of between the complete range of 400 nm to 780 nm. The values of the CIE L*a*b* color coordinates a* and b* of the transmitted visible light are each between negative 30 and positive 30.

In some embodiments, the window may further include one or more solar cells mounted on an edge or a side surface of the window; or may include a solar array comprising one or more solar cells embedded within the window.

In some embodiments, the window may yet further include one or more electrical circuits in electrical communication with the one or more edge-mounted solar cells or the solar array.

In some embodiments, the window may yet further include an electrically dimmable assembly regulating the transmission of visible and/or infrared electromagnetic radiation through the window in electrical communication with the one or more electrical circuits. The electrically dimmable assembly may be powered by the edge-mounted solar cell or the solar array.

In some embodiments, the window may yet further include a low emission film layer for reducing transmission of infrared electromagnetic radiation through the window.

In some embodiments, the window may yet further include a charge storage device in electrical communication with the edge-mounted solar cell or the solar array.

In some embodiments, the window may yet further include one or more electrical components selected from the group consisting of light sensors, color sensors, humidity sensors, temperature sensors, occupancy sensors, motion sensors, cellular signal amplifiers, universal serial bus interfaces, and wireless communication elements in electrical communication with the one or more electrical circuits.

In some embodiments, the window may be mounted in edge-mounted or mounted in a frame.

In some embodiments, the one or more electrical circuits are electrically energized by the edge-mounted solar cell; or the solar array embedded within the window. The one or more electrical circuits are positioned in the edge-mounted insulation or in the frame.

In some embodiments, the rigid transparent panel may include any combination of film, plexiglass, polymeric plate, plastic sheet, glass, quartz, or stack of such.

In some embodiments, the window may include at least one of a visibly transparent luminescent solar concentrator (LSC) or a visibly transparent photovoltaic device (PV).

In yet another embodiment, a method of making a window having a rigid transparent panel secured in a frame includes providing a rigid transparent panel including a transparent film. The transparent film includes a plurality of luminophores. The plurality of luminophores are operable to have a first peak absorbance of light in the ultraviolet (UV) spectrum and a peak emission of light in the visible spectrum. The plurality of luminophores are configured to use the absorbed light in the UV region and the visible region to emit visible light in the visible region. The rigid transparent panel has an average visible transmission (AVT) of between 35% and 95% of incident light having wavelengths in a range of between about 400 nm and about 780 nm, and the values of the CIE L*a*b* color coordinates a* and b* of the transmitted visible light are each between negative 30 and positive 30.

The method may further include coupling an edge-mounted solar cell to an edge or a side surface of the rigid transparent panel. The method may further include coupling a solar array to the rigid transparent panel.

The method may further include electrically coupling one or more electrical circuits in electrical communication with the edge-mounted solar cell or the solar array.

The method may further include electrically coupling an electrically dimmable assembly regulating the transmission of visible and/or infrared electromagnetic radiation through the window in electrical communication with the one or more electrical circuits.

Coupling a solar array to the rigid transparent panel may include coupling a visibly transparent photovoltaic device to the rigid transparent panel. The visibly transparent photovoltaic device may include at least one photosensitive layer having a first absorption peak between and including 350 nm and 420 nm and a second absorption peak between and including 420 nm and 780 nm. The second absorption peak may have a full-width half-maximum of between 10 nm and 75 nm The visibly transparent photovoltaic device may also include an anode. The anode may be configured to be in electrical communication with a first surface of the at least one photosensitive layer.

The visibly transparent photovoltaic device may also include a cathode. The cathode may be configured to be in electrical communication with a second surface of the at least one photosensitive layer.

The anode and the cathode independently may include one or more of LiF/Al, Au, Ag, a transparent conducting oxide, a transparent conducting graphene thin film, a transparent conducting nanotube film, a transparent ultrathin metal, a metal, or metal nanowires.

The visibly transparent photovoltaic device may have an average visible transmission (AVT) of between 35% and 95% of incident light having wavelengths of between 400 nm and 780 nm. The values of the CIE L*a*b* color coordinates a* and b* of the transmitted visible light may be each between negative 30 and positive 30. The visibly transparent photovoltaic device may generate electrical power.

The plurality of luminophores may include at least two or more luminophores comprising coronenes, substituted coronene-based materials, coumarins, naphthalimides, anthracenes, rubrenes, thiophenes, fluorenes, diazafluorenes, fluorenones, dicyanomethylenes, rhodamines, perylenebisimides, or bipyridines.

In yet another embodiment, window inserts can modulate transmission of electromagnetic radiation through a window and can be self-powered. To that end, a window insert may have a photovoltaic device with a photosensitive layer having 1) peak absorption between 250 nm and 450 nm and 2) an average transmittance of at least 50 percent in the visible region of the electromagnetic spectrum. The photosensitive layer, in some embodiments, includes non-fullerene organic semiconductors. For example, among other things, the photosensitive layer can have an organic electron donor and an organic electron acceptor. In that case, the photovoltaic device employs a single junction architecture generating an open-circuit voltage (V) of at least 1.4 V. A window insert can also have an electrically dimmable assembly for modulating or regulating the transmission of visible and/or infrared electromagnetic radiation through the window insert. The electrically dimmable assembly can be powered by the photovoltaic device, thereby simplifying electrical architecture of the window insert. In some embodiments, electrical infrastructure of the window insert is positioned in a siding or gasket coupled to the window insert perimeter.

In another embodiment, a method of modulating arranges a window insert in the path of electromagnetic radiation passing through the window or façade. In this example, the window insert has an electrically dimmable assembly and photovoltaic device with a photosensitive layer having peak absorption between 250 nm and 450 nm and an average transmittance of at least 50 percent in the visible region of the electromagnetic spectrum. Ultraviolet radiation is converted to electrical energy by the photovoltaic device, and the electrically dimmable assembly is powered with the electrical energy to alter the transmission of visible and/or infrared radiation through the window insert.

In yet another embodiment, a method of making visibly transparent photovoltaic device includes providing at least one photosensitive layer having a first absorption peak between and including 350 nm and 420 nm and a second absorption peak between and including 420 nm and 780 nm. The method of making visibly transparent photovoltaic device further includes providing an anode configured to be in electrical communication with a first surface of the at least one photosensitive layer. The method of making visibly transparent photovoltaic device yet further includes providing a cathode configured to be in electrical communication with a second surface of the at least one photosensitive layer. The visibly transparent photovoltaic device has an average visible transmission (AVT) of between 35% and 95% of incident light having wavelengths of between 400 nm and 780 nm. The values of the CIE L*a*b* color coordinates a* and b* of the transmitted visible light are each between negative and positive 30. The visibly transparent photovoltaic device generates electrical power. The second absorption peak may have a full-width half-maximum of between 10 nm and 75 nm.

Providing the anode may include electrically coupling one or more of LiF/Al, Au, Ag, a transparent conducting oxide, a transparent conducting graphene thin film, a transparent conducting nanotube film, a transparent ultrathin metal, a metal, or metal nanowires to the first surface of the at least one photosensitive layer.

Providing the cathode may include electrically coupling one or more of LiF/Al, Au, Ag, a transparent conducting oxide, a transparent conducting graphene thin film, a transparent conducting nanotube film, a transparent ultrathin metal, a metal, or metal nanowires to the second surface of the at least one photosensitive layer.

The at least one photosensitive layer may include an organic electron donor and an organic electron acceptor. The photovoltaic device may be a single junction architecture generating an open circuit voltage (Voc) of at least 1.4 V. The at least one photosensitive layer may include a first photosensitive layer comprising an organic electron donor. The at least one photosensitive layer may include a second photosensitive layer comprising an organic electron acceptor. The first photosensitive layer and the second photosensitive layer may form in a bilayer, planar heterojunction.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 17 shows steps of a method of making a window having a rigid transparent panel secured in a frame in accordance with illustrative embodiments.

FIG. 18 shows a method of making a visibly transparent photovoltaic device in accordance with illustrative embodiments.

DESCRIPTION OF ILLUSTRATIVE EMBODIMENTS

Figure 1:
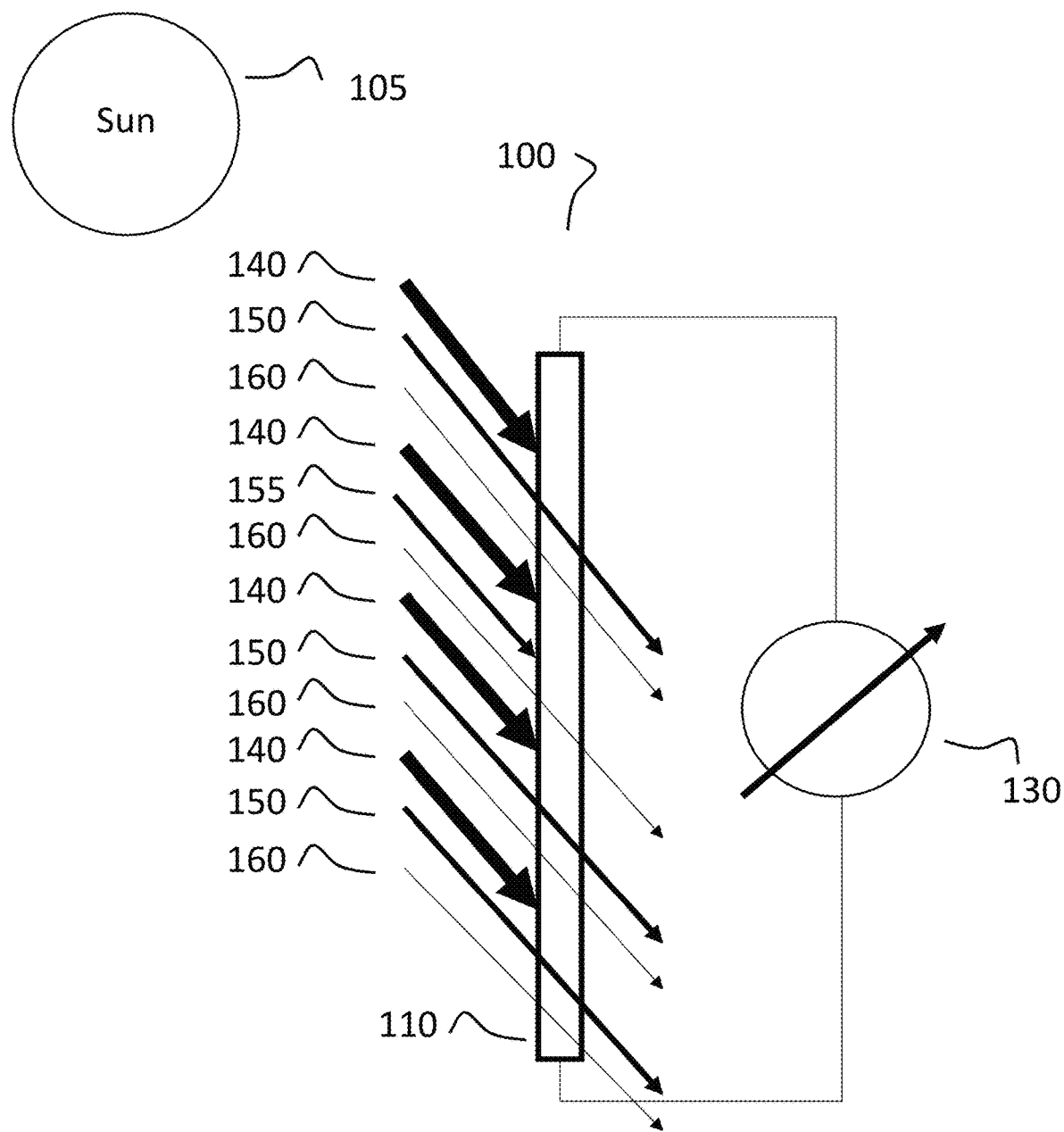
FIG. 1 schematically shows a transparent solar energy harvesting device that absorbs solar radiation from the sun to produce electrical power in accordance with illustrative embodiments.

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

Illustrative embodiments of the invention generally relate to photovoltaics and solar energy harvesting devices and, particularly, to those that are transparent or semi-transparent, allowing sufficient visible light through them to allow visualization of objects through them, and more particularly, to those that supplement their primary near ultraviolet light absorption with secondary and/or tertiary absorptions of narrow bands of visible light while maintaining their transparency. Various embodiments of the invention relate to single solar materials with both primary ultraviolet absorption and secondary, narrow-band visible absorption, while some embodiments of the invention utilize mixtures of one or more materials to realize a primary ultraviolet absorption of light with secondary, or even tertiary, narrow bands of visible light absorption. Means of manufacturing such photovoltaics and solar energy harvesting devices will also be disclosed as well as the applications and uses thereof.

Solar Energy Harvesting Devices are a broad class of devices that absorb a portion of solar radiation or light and convert it to electricity usable to an external circuit. This circuit may be a point-of-use application at the panel or window itself or for a wider power application as part of an integrated grid with other electrical delivery and generation systems. The solar energy harvesting devices may also charge energy storage systems, such as batteries. In this disclosure, the terms "light" and "radiation" are used synonymously, and the terms may be used interchangeably. Furthermore, the terms "solar cell" and "photovoltaic device" are also used synonymously, and the terms may be used interchangeably.

Silicon photovoltaic cells are one such example of solar harvesting device where a wide spectrum of solar irradiance is absorbed and converted to electricity for distribution in domestic power grids. Solar harvesting devices need not be of such scale, however, as they may be used to generate only enough power for a small hand-held device or other limited, local application. Silicon photovoltaics are very opaque by design.

There is considerable push to use visibly transparent devices to allow use in window-integrated applications on buildings and vehicles. With transparent organic photovoltaics (OPV) this can be accomplished by selectively absorbing nonvisible ultraviolet light (e.g., UV) or infrared (e.g., IR) while largely transmitting the visible portion (VIS) of the solar spectrum. An OPV device, like all solar cells, includes materials which convert incident solar photons into free electrons and positive holes. An electron/hole pair, which may be referred to as an exciton, is formed when a light photon is absorbed by the solar cell material. This exciton is then separated into free charges that are carried to the transparent electrodes on the device, generating current in an external circuit which may be used to power window-integrated applications, such as electrically-dimmable smart windows, sensors, integrated displays, and internet-of-things connectivity on buildings and vehicles, and/or charge batteries.

Transparent solar energy harvesting devices can also be realized in a transparent luminescent solar concentrator (LSC), where visible light is transmitted through while nonvisible solar radiation is absorbed, re-emitted, and waveguided to photovoltaic cells that convert this energy to electricity. In such transparent LSCs, large areas of window can absorb nonvisible solar radiation and re-emit it to the much smaller photovoltaic cells, often at the sides and edges of the window, significantly concentrating the solar energy while again allowing visible light to be transmitted through the window unit to occupants in the room or vehicle beyond it.

Whether the energy harvesting device is realized as a transparent OPV or transparent LSC, the optical transparency and aesthetic appearance of the transmitted light to the occupants is of critical importance. The quality of the transmitted light needs to be carefully characterized and optimized to give pleasant illumination to objects around the occupant while power is being generated by the nonvisible radiation. The aesthetic performance of light sources, be they a light bulb or window, can be quantified in their correlated color temperature (CCT) relating them to an ideal black body emitter, in their CIE 1931 x,y color coordinates, and in their CIE L*a*b* coordinates. (CIE 1931 being the International Commission on Illumination (CIE) in 1931.) All of these are metrics commonly used in the window and lighting industries. Unique to windows, the average visible transmission (AVT) can also be a useful metric as the window itself is not the source of the illumination itself (as a light bulb would be). Keeping such metrics in regimes that are positive and preferred for the occupants involved while generating power is paramount to the acceptance of window-based solar energy harvesting devices.

OVERVIEW

In various embodiments, the following disclosure relates to methods and systems to fabricate transparent solar energy harvesting devices that absorb ultraviolet (UV) radiation (e.g., light with wavelengths of 300 to 450 nm) to produce electrical power and, optionally, supplement their power output by absorbing an additional narrow band of visible (VIS) light (in the range of 400 to 780 nm). This additional absorption provides a meaningful increase to the photocurrent of the devices without significantly degrading their aesthetic performance (e.g., overall transparency and color neutrality). That is, these solar energy harvesting devices allow most visible light to pass though the device, while at the same time producing electrical energy. A small amount of visible light in a narrow wavelength range (or in a few narrow ranges) may be absorbed to supplement the photovoltaic energy produced by the device. These transparent solar energy harvesting devices may be used as a windowpane (e.g., window glaze) in a structure that can both allow visible light into the structure while also converting the absorbed UV radiation and narrow band(s) of visible radiation (e.g., light) into electrical energy. The electrical energy produced by the transparent solar energy harvesting devices may be used to power window-integrated applications among other applications.

Transparent solar energy harvesting devices are a broad class of devices designed to provide point-of-use electricity to power window-integrated applications such as electrically-dimmable smart windows, sensors, and integrated displays on buildings and vehicles. In certain contexts, they may also be used to provide general use power by integrating with other electrical delivery systems, such as the power grid or non-transparent solar panels and batteries.

The electrical power output of a transparent solar energy harvesting device may be increased by adding a visible light absorbing solar cell material to the device. However, for the device to remain transparent to visible light, the visible light absorbing solar cell material must not absorb so much light that the transparent device starts to lose its transparency. That is, the transparency and color neutrality of the resultant device must be only minimally affected by the absorption of this visible light absorbing solar cell material to avoid undermining its aesthetic performance.

To demonstrate the additional power output potential of absorbing even a thin (20 nm) wide band of the visible spectrum, Table 1 lists the irradiance contained in 20 nm wide bands of the solar spectrum referenced to all the irradiance with a wavelength less than 400 nm, as well as the photon flux contained in these 20 nm wide bands. For example, wavelengths between 540 and 560 nm of the solar spectrum contain 33% as much power as the UV and near-UV wavelengths less than 400 nm. This illustrates the potential for supplemental electrical power generation through even just one of these narrow 20 nm wide bands of the visible spectrum.

TABLE 1

Breakdown of additional power available and additional photon flux available in 20 nm wide bands of the solar spectrum referenced to the power and photon flux contained in all wavelengths <400 nm

| Wavelength Range | Additional power available | Additional photon flux available |
|---|---|---|
| 400-420 | 25% | 33% |
| 420-440 | 26% | 33% |
| 440-460 | 32% | 41% |
| 460-480 | 34% | 44% |
| 480-500 | 33% | 44% |
| 500-520 | 33% | 44% |
| 520-540 | 33% | 46% |
| 540-560 | 33% | 47% |
| 560-580 | 32% | 48% |
| 580-600 | 32% | 49% |
| 600-620 | 32% | 49% |
| 620-640 | 31% | 48% |
| 640-660 | 30% | 47% |
| 660-680 | 30% | 47% |
| 680-700 | 27% | 47% |
| 700-720 | 27% | 46% |
| 720-740 | 25% | 45% |
| 740-760 | 26% | 44% |
| 760-780 | 21% | 44% |

To accomplish the harvesting of these additional, narrow bands of visible solar irradiance while still primarily harvesting near ultraviolet light (ranging in wavelength from 300 nm to 450 nm) and maintaining overall transparency, the ideal material would have a broad-band strong absorption in the UV portion of the solar spectrum and a narrow-band absorption in the VIS region. The broad-band absorption in the UV region would be separated from the narrow-band absorption in the VIS by a valley in the absorption spectrum that approaches complete transparency.

Table 1 shows that for a transparent solar energy harvesting device that primarily absorbs UV-light, adding absorption of just one of these 20 nm slices could represent a 21% to 34% increase in available power. The narrowness of any secondary absorption peak as measured by its full-width at half maximum (FWHM) should be less than 100 nm, more preferably less than 50 nm, and preferably less than 20 nm. The lower intensity of secondary peaks, and the narrowness of the width of these peaks is selected to maintain the overall transparency of the resultant device by only minimally affecting its aesthetic performance.

To understand and quantify the potential aesthetic impact of the absorption by these thin wavelength bands on the transparency and color neutrality of the resultant devices, Table 2 illustrates the calculated effects on various aesthetic metrics. Here, the absorption bands were simulated with full-width at half maximum (FWHM) of 20 nm moving through the solar emission spectrum, the standard AM1.5G, in 20 nm increments. Two absorption intensities with optical densities of 0.3 (absorbing approximately 50% of light at its peak) and 1.0 (absorbing approximately 90% of light at its peak) are used and the resultant average visible transmission (AVT, photoptically-weighted) and color coordinates (in CIE L*a*b* and CIEx,y 1931 systems) are calculated and shown for each intensity. In general, absorption of both short and long wavelengths that are weakly detected by the eye does not significantly degrade transparency nor color neutrality, while absorption of green wavelengths where the eye is more sensitive have a large impact. The color coordinates of the solar spectra with no absorption are also shown in the top row of Table 2.

and even more preferably less than 10. The CIEx,y 1931 coordinates should be within 0.100 of [0.332, 0.334], more preferably within 0.030, and even more preferably within 0.010 for each coordinate. The color difference, delta E or dE, defined in 1976 is a three-dimensional color difference calculated from the CIE L*a*b* coordinates according to the 1976 standard can also be used to describe how different the color of this transparent layer is from an ordinary window, and so dE should be less than 60, more preferably less than 20, and even more preferably less than 5. For example, a dE of 60 may correspond to a range of a* and/or b* from between −30 and 30. The ranges of values described above for transparency and color neutrality represent aesthetic performance for transparent solar energy harvesting devices that is found to be pleasing.

Solar energy materials that have absorption characteristics similar to those described above include derivatives of tetrabenzofuranyldibenzocoronene. Materials such as these are employed in a variety of the embodiments described herein. They are novel, single materials for use in a variety of the device embodiments described in this disclosure. Representative absorption spectra of these materials include a primary absorption in the near ultraviolet and a few, small, narrow absorption peaks in the visible portion of the spectrum. The photoluminescence emission for these materials show emission in the visible portion of the spectrum. These coronenes demonstrate absorption in the UV and the visible regions of the spectrum, as well as emission peaks in the visible portion of the spectrum. While these coronenes demonstrate these absorption and emission characteristics, they are by no means the only material or materials that display these characteristics. In illustrative embodiments, a combination of one or more materials may be used that absorb in the UV and the visible regions of the spectrum, as well as emit in the visible portion of the spectrum.

TABLE 2

Change in Aesthetic Metrics of Transmitted AM1.5G Sunlight Assuming the Secondary Absorption has Optical Densities of 0.3 and 1.0 with Gaussian shapes and Full-Width At Half Maximum (FWHM) of 20 nm centered in the middle of each of the 20 nm bands below.

| Center (nm) | | O.D. 0.3 | | | | | O.D. 1.0 | | | | |
|---|---|---|---|---|---|---|---|---|---|---|---|
| Wavelength | Range of FWHM | AVT | L* | a* | b* | CIEx, y 1931 | AVT | L* | a* | b* | CIEx, y 1931 |
| No Absorption | | 100.0 | 100.0 | 0.00 | 0.00 | [0.332, 0.344] | 100.0 | 100.0 | 0.00 | 0.00 | [0.332, 0.344] |
| 390 | 380-400 | 100.0 | 100.0 | −0.09 | 0.17 | [0.332, 0.344] | 100.0 | 100.0 | −0.22 | 0.43 | [0.333, 0.345] |
| 410 | 400-420 | 99.9 | 100.0 | −0.92 | 1.88 | [0.334, 0.348] | 99.8 | 100.0 | −2.16 | 4.44 | [0.336, 0.353] |
| 430 | 420-440 | 99.7 | 100.0 | −3.66 | 8.02 | [0.340, 0.360] | 99.4 | 99.9 | 8.02 | 18.46 | [0.351, 0.381] |
| 450 | 440-460 | 99.5 | 99.8 | −5.24 | 13.59 | [0.347, 0.371] | 99.0 | 99.6 | −11.25 | 31.98 | [0.367, 0.407] |
| 470 | 460-480 | 99.0 | 99.6 | −1.92 | 9.80 | [0.345, 0.362] | 97.9 | 99.0 | −4.14 | 22.80 | [0.363, 0.385] |
| 490 | 480-500 | 97.7 | 99.0 | 3.49 | 2.64 | [0.341, 0.346] | 94.9 | 97.7 | 7.69 | 6.12 | [0.353, 0.349] |
| 510 | 500-520 | 94.7 | 97.7 | 9.25 | −2.51 | [0.341, 0.333] | 88.4 | 94.9 | 20.54 | −5.59 | [0.351, 0.320] |
| 530 | 520-540 | 91.1 | 96.2 | 12.77 | −6.08 | [0.339, 0.325] | 80.9 | 91.6 | 28.78 | −13.66 | [0.348, 0.301] |
| 550 | 540-560 | 89.4 | 95.6 | 10.24 | −7.44 | [0.334, 0.324] | 77.1 | 90.1 | 23.62 | −16.87 | [0.335, 0.298] |
| 570 | 560-580 | 89.6 | 95.9 | 3.00 | −7.02 | [0.324, 0.330] | 77.5 | 90.7 | 7.05 | −15.93 | [0.314, 0.311] |
| 590 | 580-600 | 91.5 | 96.8 | −5.27 | −5.47 | [0.316, 0.338] | 81.7 | 92.8 | −12.27 | −12.32 | [0.294, 0.330] |
| 610 | 600-620 | 94.2 | 97.9 | −9.35 | −3.66 | [0.314, 0.344] | 87.5 | 95.3 | −21.39 | 8.12 | [0.290, 0.344] |
| 630 | 620-640 | 96.8 | 98.9 | −7.09 | −1.93 | [0.320, 0.345] | 93.0 | 97.5 | −16.04 | 4.28 | [0.304, 0.347] |
| 650 | 640-660 | 98.7 | 99.5 | −3.40 | −0.79 | [0.326, 0.345] | 97.1 | 99.0 | −7.62 | −1.77 | [0.319, 0.346] |
| 670 | 660-680 | 99.6 | 99.9 | −1.16 | −0.25 | [0.330, 0.344] | 99.1 | 99.7 | 2.59 | −0.57 | [0.328, 0.345] |
| 690 | 680-700 | 99.9 | 100.0 | −0.30 | −0.07 | [0.332, 0.344] | 99.8 | 99.9 | −0.69 | −0.15 | [0.331, 0.344] |
| 710 | 700-720 | 100.0 | 100.0 | −0.07 | −0.02 | [0.332, 0.344] | 99.9 | 100.0 | 0.16 | −0.03 | [0.332, 0.344] |
| 730 | 720-740 | 100.0 | 100.0 | −0.05 | 0.00 | [0.332, 0.344] | 100.0 | 100.0 | −0.11 | −0.01 | [0.332, 0.344] |

AVT is Average Visible Transmission and the CIE L*a*b* and CIEx, y 1931 color coordinates of the transmitted light are listed.

In some embodiments, the average visible transmission (AVT) should be greater than 50%, more preferably greater than 80%, and even more preferably greater than 90%. The CIE L*a*b* components, a* and b* should have their absolute values less than 30, more preferably less than 20, Transparent Organic Photovoltaic (OPV)

A transparent organic photovoltaic (OPV) energy harvesting device is a solar cell (e.g., photovoltaic device) which employs organic material(s) to absorb UV light (e.g., radiation) and convert it into usable electricity. An OPV is transparent to visible light but absorbs UV light. In used herein, the terms "light" and "radiation" are used synonymously, and the terms may be used interchangeably. Furthermore, the terms "solar cell" and "photovoltaic device" are also used synonymously, and the terms may be used interchangeably.

An OPV photovoltaic device, like all solar cells, includes materials which convert photons from the radiation that strikes the solar cell into an electron and a positive hole. That is, an electron/hole pair is formed when a light photon is absorbed by the solar cell material. The electron/hole pair may be referred to as an exciton.

The OPV solar cell material is composed of photoactive layer or bilayer that is comprised of two types of molecules—an electron donor and an electron acceptor. These two materials form a heterojunction with suitable energy levels to dissociate excitons into free charges that can be extracted from the device as current. Excitons are generated in the photoactive layer or bilayer by optical absorption, thus the absorption spectrum of an OPV can be modified by replacing or chemically modifying the donor and/or acceptor. That is, by modifying the donor and/or the acceptor it is possible to change the characteristics of the absorption spectrum of the OPV solar cell.

Suitable electron donor materials include, but are not limited to, triarylamines, arylcarbazoles, fluorenes, spirofluorenes, coronenes, thiophenes, oligothiophenes, benzothiophenes, and benzodithiophenes. Specific, representative examples include, but are not limited to, TPD, NPB, m-MTDATA, TAPC, Spiro-OMeTAD, BF-DPB, BF-DPP, BF-DPN, BF-DPA, mCP, TCTA, BTE-Cl, hexabenzocoronene, tetrabenzofuranyldibenzocoronene, and tetrabenzothiophenyldibenzocoronene.

Suitable electron acceptor materials include, but are not limited to, phenanthrolines, pyridinyl-containing pyrimidine molecules, benzimidazoles, quinolato aluminum complexes, triazines, oxidiazoles, arylphosphine oxides, triazoles, and fullerenes. Specific, representative examples include, but are not limited to, BPhen, B4PyMPM, TPBi, Alq3, BTB, OXD-7, DPEPO, TAZ, $C_{60}$, $C_{70}$, PCBM.

An OPV solar cell, like other solar cells, also requires transparent conducting electrodes (e.g., transparent electrodes) to collect the electrons and the holes that are generated by the photovoltaic (e.g., PV) material when it absorbs the radiation. Transparent conducting electrodes (for example indium tin oxide (ITO) or thin metals/metal grids) sit both beneath and above the device stack, which is comprised of an optional electron transporting layer, a photoactive layer (or bilayer), and an optional hole transport layer.

Narrow-Band Visible Photovoltaic

The electrical power output of a transparent organic photovoltaic (OPV) energy harvesting device may be increased by adding a visible light absorbing solar cell material to the device. However, for the transparent OPV device to remain transparent to visible light, the visible light absorbing solar cell material must not absorb so much light that the transparent OPV starts to lose its transparency. That is, the transparency and color neutrality of the resultant device must be only minimally affected by the absorption of this visible light absorbing solar cell material to avoid undermining its aesthetic performance, as delineated above.

The addition of a visible light absorbing solar cell material to an OPV device that only minimally affects the transparency and the color neutrality of the resultant device may be achieved by adding an amount and/or a composition of a visible light absorbing solar cell material that absorbs only a narrow additional band of visible light. The presence of a narrow band visible absorber that converts visible light to electrical energy will only absorb a narrow band of visible light (e.g., VIS). The spectrum of the combination UV-VIS transparent OPV could represent the absorption spectrum of a single absorber, multiple absorbers, or a full stack transparent device.

There are several embodiments to implementing a PV material that absorbs only a narrow additional band of visible light to an OPV device. For example, in illustrative embodiments, an organic absorber (small molecule or polymer) that primarily absorbs non-visible light but also has a secondary visible absorption peak could be incorporated to provide a narrow window of visible light absorption in combination with a UV absorber.

Another implementation may include adding a new type of visible-absorbing organic molecule or inorganic nanoparticle to an otherwise visibly transparent device to sensitize it to these wavelengths. For example, in illustrative embodiments, a third organic absorber could be added to form a ternary blend. That is, with two molecules forming the primary UV absorbing organic heterojunction, a third molecule and/or compound may be added to the primary organic absorbers to sensitize the device to a slice of visible wavelengths.

Suitable organic absorber materials include, but are not limited to, coumarins, naphthalimides, coronenes, anthracenes, rubrenes, thiophenes, fluorenes, diazafluorenes, fluorenones, dicyanomethylenes, rhodamines, perylenebisimides, and bipyridines.

Yet another implementation may include employing an organic material with a visible absorption peak as either the donor or acceptor in an otherwise transparent organic heterojunction.

OPV Device Design and Formation

OPVs can be deposited via thermal evaporation under high vacuum ($<10^{-5}$ Torr), organic vapor phase deposition under low vacuum (where a carrier gas transports hot organic molecules to the substrate), organic vapor jet printing (where hot organic molecules are propelled through a nozzle by a carrier gas), or through solution-processing techniques (which include, but are not limited to, drop coating, spin coating, slot die coating, slide coating, curtain coating, inkjet printing, stream coating, blade coating, and spraying).

Many of these deposition processes are compatible with roll-to-roll deposition on flexible substrates, and all are compatible with batch coating on rigid substrates. In the vacuum/vapor processing methods the absorbers, including potentially a third component for visible light sensitization, would be deposited either sequentially in layers to form a "planar" heterojunction (a bilayer) or co-deposited simultaneously to form a homogeneous "blended" heterojunction.

In solution processing techniques, the absorbers would be dissolved into a solution or multiple solutions prior to coating. The organic molecules themselves could be either small molecule monomers or polymeric materials. The ratio of the organic absorbing components (at least two heterojunction materials, and perhaps a third visible sensitizing component) may be tuned to provide optimal photovoltaic and optical/aesthetic performance when integrated into a full-stack device. Ratios of 1:1 electron donor to electron acceptor are common, though ratios of up to 20:1 donor:acceptor or 1:20 donor:acceptor may be beneficial in certain materials systems. Components and carrier materials can also be deposited in sequential layers to add features and functionality with differing absorbers in differing layers.

The thickness of the organic absorbing layer is commonly 50-300 nm for blended heterojunction OPVs, but can be as thin as 10 nm for some planar heterojunction OPVs.

The required thickness of the visible "slice" absorbing material depends on its absorption strength (e.g., absorption coefficient) in the desired wavelength range, and the amount of absorption targeted. It is useful to define an effective optical thickness of the visible absorber, which is essentially what total thickness of the material would light pass through on its way through the device. For example, in a 100 nm thick absorbing layer, which contains 10% of the visible absorbing component, the effective optical thickness of this component is 10 nm. The effective optical thickness required to achieve a certain percent absorption of a certain wavelength can be calculated as: (effective optical thickness)= (absorption coefficient)/(natural logarithm of the targeted percent absorption).

In some embodiments, transparent OPV devices may include devices that have a primary absorption and PV performance in the near infrared (e.g., near-IR) portion of the solar spectrum. That is, rather than absorbing radiation in the UV portion of the solar spectrum, the near-IR PV devices primarily convert IR energy into electrical energy. A narrow slice of VIS light absorption may be added to a near-IR transparent OPV in the same way that the slice of VIS may be added to the UV absorbing device to supplement the power production of the OPV device.

Transparent Luminescent Solar Concentrator (LSC)

A luminescent solar concentrator (LSC) is a device that produces electricity by collecting radiation over an area of film, plexiglass, polymeric plate, plastic sheet, glass, laminated glass, or flat substrate converting the absorbed energy into photoluminescence, and directing (waveguiding) the re-emitted radiation (e.g., photoluminescent emission) in plane to photovoltaic cells at the periphery of the film, plexiglass, polymeric plate, plastic sheet, glass, laminated glass, or flat substrate. The film, plexiglass, polymeric plate, plastic sheet, glass, laminated glass, or flat substrate can act as a waveguide for absorbed radiation, which is concentrated as re-emitted light in plane and harvested at the periphery of the film, plexiglass, polymeric plate, plastic sheet, glass, laminated glass, or flat plate, for electricity.

For these LSCs to be transparent, the absorption of their luminophores should be primarily outside of the visible spectrum, absorbing primarily near ultraviolet (such as UVA) light with its strongest absorption peak between 300 and 450 nm. In some embodiments, these luminophores may emit radiation in the visible spectrum peaking between 400 and 780 nm, usually via photoluminescence or phosphorescence. In some embodiments, a secondary band (or bands) of visible light absorption (again between 400 and 780 nm in wavelength) is intentionally introduced to the device to supplement power generation while maintaining excellent aesthetic performance in terms of overall transparency and color neutrality.

This can be accomplished via careful selection of a luminophore or a combination or mixture of luminophores. Single luminophores that have a dominant absorption peak in the near ultraviolet and a secondary peak or peaks in the visible are suitable to this end. Specific, non-limiting examples of this type of luminophore are novel coronenes, such as the functionalized hexabenzocoronenes, tetrabenzofuranyldibenzocoronenes, or tetrabenzothiophenyldibenzocoronenes. Combinations, mixtures, or blends of previous known organic luminophores can be carefully selected to achieve the predominant ultraviolet absorption with a carefully crafted secondary, visible absorption band or bands.

Suitable luminophore combinations or blends could include, but are not limited to, two or more of the following: coumarins, naphthalimides, coronenes, anthracenes, rubrenes, thiophenes, fluorenes, diazafluorenes, fluorenones, dicyanomethylenes, rhodamines, perylenebisimides, and bipyridines. In some embodiments, these luminophores may be carefully blended in a mixture or combination to supplement the power generation with a secondary, visibly-absorbing band while maintaining excellent overall transparency and color neutrality.

In addition, the mixtures and combinations of luminophores may also be utilized to allow better spectral matching of their composite light re-emission with the side-mounted photovoltaics producing the electricity more efficiently. Also, such tuning of the composite light re-emission can lessen self-absorption of the luminophores throughout the LSC and allow for improved size scaling of the area of these devices.

LSC Device Design and Formation

In some embodiments, example materials for waveguides include, but are not limited to, glass, quartz, polycarbonate, polymethylmethacrylate, polyamide-imide, polyvinylidene fluoride, and can be amorphous or crystalline materials or a combination thereof. A transparent film or hard coating on one or more surfaces of the waveguide can include, but is not limited to, cellulose acetate butyrate, acrylic, acrylate-on-glass, ionoplast polymer, acetate, polyvinyl butyral, polyurethane, or thermoplastic polyurethane that includes one or more of the luminophores, including, but not limited to, all the example luminophores listed previously for LSCs. The refractive indices for these waveguides, films, and coating should be within the range of n=1.2 to 1.9, more preferably n=1.3 to 1.8. The thickness of the entire active LSC assembly can vary from 100 nm for standalone films up to 5 cm for glass or plastic laminates as the waveguides sandwiching interlayer films or even solid 5 cm thick plexiglass plates.

The optical and aesthetic properties of the LSC substrate are determined by the type of luminophore(s) embedded in the host material, and its (their) concentration in or on the LSC substrate. The concentration of the luminophore(s) in the host material determine its effective optical thickness, as defined above. Concentrations of the luminophore(s) are independently typically 10.0 to 0.000001 wt. %, with typical effective optical thicknesses of 1.0 nm to 1.0 mm, more preferably 10 nm to 1.0 μm. In order to realize a supplementary slice of visible absorption in an LSC, either the primary non-visible absorbing luminophore has a secondary visible feature or features inherent in the luminophore, or an additional visible absorbing luminophore or luminophores may be added to the sample.

These LSC active layers containing the luminophores can be made by thermal evaporation; solid or solution mixing to prepare for melt-processing; or solution processed to coat interlayers or substrates. The luminophores and host components can be deposited or co-deposited via thermal evaporation under high vacuum (<$10^{-5}$ Torr), organic vapor phase deposition under low vacuum (where a carrier gas transports hot organic molecules to the substrate), or organic vapor jet printing (where hot organic molecules are propelled through a nozzle by a carrier gas). Alternatively, the luminophores can be mixed with monomers, polymers, adhesion promoters, and other components through solid mixing; grinding; dissolution and drying; or dissolved and kept in solution together. These mixtures can be melt-processed by extrusion or injection molding into interlayers or impregnated rigid substrates. As another option, the luminophores can be co-dissolved with monomers, polymers, adhesion promoters, and other components and then deposited through solution-processing techniques (which include, but are not limited to, drop coating, spin coating, slot die coating, slide coating, curtain coating, inkjet printing, stream coating, blade coating, and spraying) onto interlayers or rigid substrates directly. Many of these solution deposition processes are compatible with roll-to-roll deposition on flexible substrates, and all are compatible with batch coating on rigid substrates. Components and carrier materials can also be deposited in sequential layers to add features and functionality with differing absorbers in differing layers.

These active layers can directly include the rigid substrates as waveguides or can be coated on, adhered to, or laminated between rigid waveguides be they polymeric, glass, or otherwise. The functional LSC is then formed by mounting photovoltaic cells on the edges of the waveguide to convert the absorbed and re-emitting light into electricity. These photovoltaic cells can for example be, but are not limited to, traditional monocrystalline silicon cells, amorphous silicon cells, gallium arsenide cells, cadmium telluride cells, copper indium gallium selenide cells, photovoltaic strips, dye-sensitized solar cells, or organic photovoltaic cells. The luminophore composition may not only be tuned for the predominantly ultraviolet absorption with supplementary visible absorption, but also optimized for their aggregate re-emission spectrum to suit the photovoltaic cells chosen for the edges of this LSC assembly.

In some embodiments, an LSC device may be comprised of a transparent waveguide host (e.g., LSC substrate) such as film, plexiglass, polymeric plate, plastic sheet, glass, or stack of such, with one or more luminophores contained in, on, or between parts of this substrate/stack that absorb solar radiation and emit light during device operation. This emitted light travels through the medium of the waveguide LSC substrate to an edge where it is absorbed by a photovoltaic device and converted to electrical energy.

In illustrative embodiments, the luminophore can be contained in or on an interlayer that is coated on, adhered to, melted onto, or laminated between the LSC waveguide substrates mentioned above in any combination of film, plexiglass, polymeric plate, plastic sheet, glass, or stack of such to incorporate into the resultant LSC device.

In illustrative embodiments, the luminophore or luminophores may be deposited by thermal evaporation or solution-processing with other transparent materials, such that the luminophores are dispersed in the other transparent materials in films on a interlayer. Such luminophore-containing films may be deposited on one or both sides of the interlayer, with differing luminophores or compositions of luminophores on each side. Such luminophore-containing films may also be deposited subsequently forming stacked thin-films on the interlayer with differing luminophore or transparent components in each layer. These coated interlayers may then be incorporated into LSC devices as above.

In illustrative embodiments, the interlayer itself may be fabricated by embedding luminophores into a liquid or melted host material, then extruding, injection molding, and/or laminating the sheet before curing or cooling it into a solid interlayer for incorporating into LSC devices as above.

In some embodiments, the luminophore or luminophores may be deposited by thermal evaporation or solution-processing with other transparent materials, such that the luminophores are dispersed in the other transparent materials in films directly on the transparent, rigid waveguide. Such luminophore-containing films may be deposited on one or both sides of the waveguide substrate, with differing luminophores or compositions of luminophores on each side. Such luminophore-containing films can also be deposited subsequently forming stacked thin-films on the waveguide substrate with differing luminophore or transparent components in each layer. These coated transparent waveguides can then be incorporated into LSC devices.

In some embodiments, an LSC substrate may be fabricated by embedding luminophores into a liquid or melted host material, then extruding, injection molding, and/or laminating the sheet before curing or cooling it into a solid. This LSC substrate can then be made into an LSC device by mounting the photovoltaic cells on its edges.

In some embodiments, the luminophores may be mixed with monomeric components sandwiched between transparent waveguide substrates and crosslinked through addition of energy such as, but not limited to, heat, ultraviolet light, or microwaves, to result in a 100% solids crosslinked layer between the two transparent waveguide substrates. This LSC stack can then be made into an LSC device by mounting the photovoltaic cells on its edges.

Applications in Smart Windows and Smart Window Inserts

UV-absorbing OPV and LSC devices may be utilized in architectural glazing, automotive glass, aerospace glass, display glass, and a variety of other applications for the built environment, consumer devices, transportation vehicles and infrastructure, and military devices and infrastructure. When utilized in a window product, such as a window, door, curtain-wall, window-wall, punch window unit, OPV and LSC devices can serve as a glass or plexiglass lite in a single-, double-, or triple-pane insulated glass unit. The LSC device can be incorporated into glass or window products for use in new construction, renovation, or retrofitting. This renovation or retrofitting can be done with insulated glass unit inserts to allow existing windows and frames to accept such smart window systems.

Electrically-dimmable/tintable smart windows such as those based on electrochromic films are a rapidly growing market. Due to the high cost of electrically wiring such windows, and the relatively low power required to operate them, UV-absorbing OPVs and LSCs offer a potential solution to provide local point-of-use power without degrading the aesthetic performance of the window. A common drawback of smart windows is their color which reduces visual comfort and creates unnatural lighting conditions compared with a color-neutral window.

As described above, the optical properties of both LSCs and OPVs are highly tunable based on their composition and the chemical design of the absorbing materials. This tunability could be used to compensate for any undesirable color of smart windows—for example to absorb additional blue light when pairing with smart windows that appear blue, thereby creating a flatter, more neutral transmission spectrum.

In some smart window applications such as environmental-sensing, internet-of-things connectivity and control, and heat-regulating smart windows, the supplemental power generation from the slice of visible light absorption can provide additional, internal power for these systems. The color-tunability highlighted above for use with electrically-dimmable/tintable smart windows is an added benefit for these applications as well, allowing for more flexibility in design of those elements using the OPV or LSC devices disclosed herein to compensate for any compromises those elements make in their color neutrality.

As described herein, window inserts are provided for fenestration comprising a unique combination of ultra-violet-absorbing/visibly-transparent photovoltaic devices and monolithically-integrated electrically-dimmable thin films and/or low-emission films and/or environmental sensors that results in solar-powered regulation of visible and near-infrared light, and is thus a free-standing product not requiring external power. In some embodiments, the light-active layers of the insert comprise, in order of sunlight incidence, i) a photovoltaic and/or luminescent solar concentrator set of layers that primarily harvest ultraviolet light, while transmitting the majority of visible and near-infrared light; and ii) in some embodiments, an electrically-dimmable set of layers that primarily regulate transmission of visible and/or near-infrared light; and iii) in some embodiments, a low-emission set of layers that primarily serves to reflect infrared light. In some embodiments of the window insert, the ultraviolet-absorbing visibly-transparent photo-voltaic device layer also provides power to on-board hardware including i) sensors, such as temperature and humidity sensors; and/or ii) energy-storage elements, such as batteries and/or capacitors; and/or iii) wireless communication devices, such as Wi-Fi and/or Bluetooth adapters.

In some embodiments, the window insert permits integration of transparent photovoltaic or transparent luminescent solar concentrator layers, that convert unlight into on-board electricity, with on-board sensors and/or electrically-dimmable layers and/or low-emission layers, that regulate sunlight transmission to optimize lighting conditions and control solar heat gain. Technical advancements lie in the selective harvesting of non-visible light for on-board electricity, monolithically-integrated with complementary functional layers such as electrically-dimmable layers that require electrical power for operation. In some embodiments, the inserts comprise hardware elements such as internal wiring; energy storage in the form of batteries and/or capacitors; a series of temperature, light, humidity and other environmental sensors; and a wireless communication element operating at a frequency between 200 MHz-10 GHz.

When the above elements are combined according to the designs detailed herein and provided in the figures, the result is a free-standing, self-powered smart window insert that can be utilized adjacent to and over the same spatial area as existing fenestration to provide on-board power for sensor-based data collection of environmental conditions, and/or solar-powered regulation of sunlight transmission, without requiring external power or installation by an electrician or window glazier. The immediate applications for such products are in augmenting fenestration in buildings, automobiles, airplanes, trains, and marine craft. On-board transparent solar power uniquely enables a free-standing, retrofittable, window upgrade solution for a diverse range of applications. With the described window insert, smart window function can be endowed to existing windows without the cost and complexity of replacing the existing glass with an externally-wired double- or triple-pane insulated smart glass window unit. Inserts described herein comprise, in part or in whole, a transparent photovoltaic or transparent luminescent solar concentrator layer or set of layers for purposes of providing on-board power.

The window inserts, in one embodiment, comprise a light-harvesting element that is a single-junction photovoltaic device comprising organic semiconductors as active ingredients. In such embodiments, organic electron donor and acceptor layers exhibit peak absorbance in the range 250 nm to 450 nm. Therefore, the photovoltaic active layer is largely transparent to light in the visible and near-infrared regions. For example, the photovoltaic active layer can generally exhibit an average transmittance in the visible light region of 60 percent to 100 percent. In such an embodiment, the ultraviolet absorbers utilized in the single-junction organic solar cell can be fabricated using one or a combination of vacuum deposition, chemical vapor deposition, spin-coating, blade-coating, spray-coating, or other solution or roll-to-roll process. Suitable electron donor and electron acceptor layers, in some embodiments are disclosed in U.S. patent application Ser. No. 15/577,965 and are herein incorporated by reference.

In some embodiments, a light-harvesting element comprises a transparent luminescent concentrator film including organic semiconductors as active ingredients, wherein the active ingredients primarily absorb ultraviolet light and emit visible and/or near-infrared light. In such embodiments, organic ultraviolet-absorbers exhibit peak absorbance in the range 250 nm to 450 nm and peak emission in the range 500-1000 nm. The luminescent concentrator film area is largely transparent to light in the visible and near-infrared regions. For example, the photovoltaic active layer can generally exhibit an average transmittance in the visible light region of 70 percent to 100 percent. In some embodiments, the ultraviolet absorbers utilized in the luminescent concentrator film can be fabricated using one or a combination of drop-casting, spin-coating, blade-coating, spray-coating, extruding, injection-molding, laminating, or other solution or roll-to-roll process. Suitable organic ultraviolet absorbers can comprise one or more contorted hexabenzocoronene (cHBC) derivatives. In some embodiments, for example, a luminophore is tetrabenzofuranyldibenzocoronene. Luminophores can be dispersed in various polymeric matrices to form the luminescent concentrator film. Any suitable transparent polymeric material can be employed including, but not limited to, polyacrylates, polyalkylacrylates, polycarbonates, and polyethylene terephthalate.

Various designs of the window inserts are detailed in the figures, with insert data for two exemplary embodiments of the ultraviolet (UV) solar layer that produced electricity for on-board power. The ultraviolet (UV) solar layer is expected to absorb between 50-100% of solar irradiation having wavelengths <420 nm, prior to transmission of the remaining solar photons i) internally to adjacent, monolithic layers such as electrically-dimmable layers and/or low-emission layers; and/or ii) through the window insert.

For applications previously utilizing externally-powered, electrically-dimmable double-pane insulating glass units installed via window glaziers and electricians, inserts having composition and architectures described herein will substantially reduce the cost and complexity of delivering dynamic sunlight transmission functions by decoupling these functions from electrician and window glazier labor. The window inserts can potentially lead to widespread augmentation of existing fenestration with electrically-dimmable glass or film technologies that are not presently available in a retrofittable fenestration product.

FIG. 1 schematically shows transparent solar energy harvesting device 100 that absorbs solar radiation from the sun 105 to produce electrical power. The transparent solar energy harvesting device 100 includes a transparent substrate 110 that comprises transparent organic solar energy harvesting materials (organic photovoltaics, OPV, or luminescent solar concentrators, LSC). These OPV or LSC materials and systems convert the solar radiation energy into electrical energy that may be collected by an electrical circuit 130.

The OPV or LSC materials include materials which convert UV radiation into electrical power or re-emit the light to waveguide to photovoltaic cells to convert it into electrical power. Therefore, the substrate 110 is not transparent to UV light, but it absorbs the UV radiation arriving at the substrate.

The OPV or LSC materials may also include materials that absorb a narrow slice of visible light. The narrow slice may be of the order of 5 nm to 100 nm of the wavelengths of the solar radiation striking the substrate. This narrow absorption band may only minimally diminish the visible light transparency of the substrate.

The solar radiation includes at least ultraviolet (e.g., UV) radiation 140, visible (e.g., VIS) light 150 and 155, and infrared radiation (e.g., IR) 160. As used in this disclosure, radiation and light are interchangeable and synonymous. The solar radiation strikes the substrate 110 comprising the transparent OPV or LSC materials. The transparent OPV or LSC materials absorb the UV radiation 160 as illustrated by the UV radiation 160 not passing through the substrate 110. The IR radiation 160 passes through the substrate 110.

The transparent OPV or LSC materials may also include an amount of visible light absorbing photovoltaic or luminescent materials. Some of the visible radiation 150 passes through the substrate 110 as visible light. However, some of the visible light is absorbed by the visible light absorbing photovoltaic or luminescent materials, as illustrated by visible light ray 155. Like for the UV photovoltaic or luminescent materials, the visible light absorbed by the visible light absorbing photovoltaic or luminescent materials is converted by the materials into an electrical current in the circuit 130, or re-emitted for edge-mounted photovoltaic cells to convert into electrical current in the circuit 130. The electrical current may be used by other devices, or may be stored in a storage medium, such as a battery. The transparency and color neutrality of the resultant device is only minimally affected by absorption of the 5 nm to 100 nm narrow band of visible light that is absorbed by the visible light absorbing photovoltaic or luminescent materials present in the OPV or LSC materials.

Figure 2:
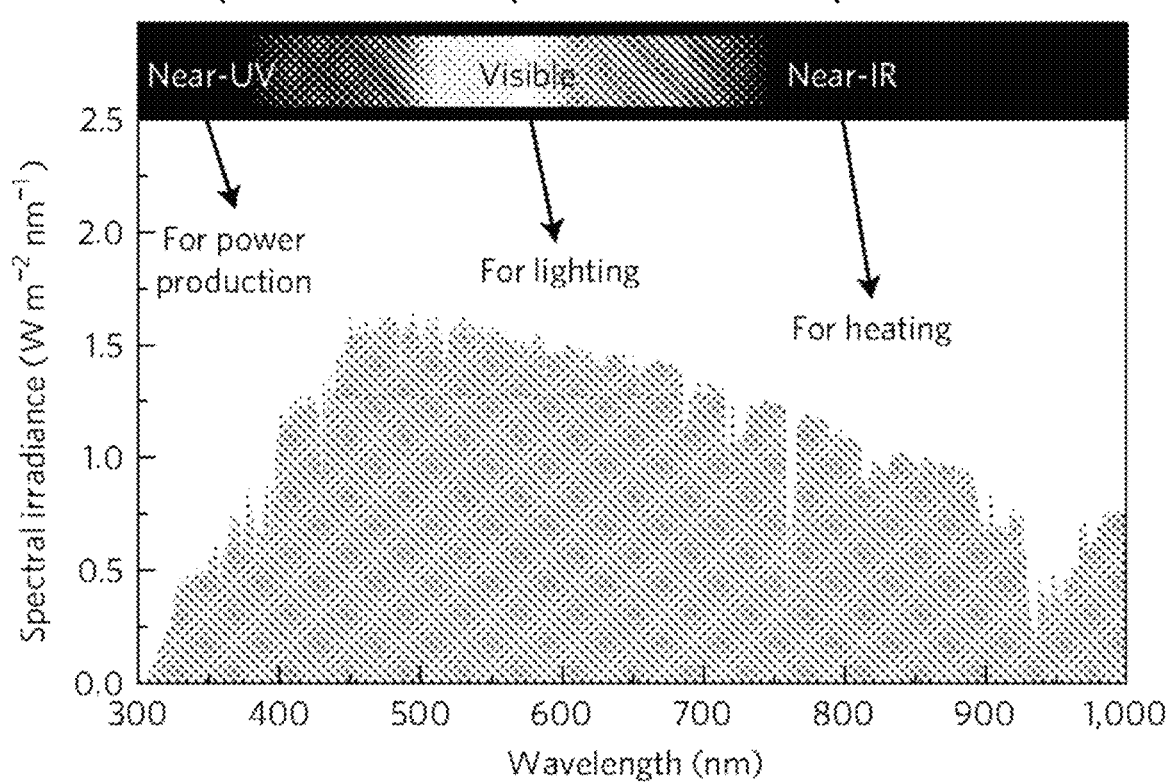
FIG. 2 graphically illustrates an exemplary spectrum of spectral irradiance versus wavelength for a solar spectrum in accordance with illustrative embodiments.

FIG. 2 schematically illustrates an embodiment of a spectrum of spectral irradiance versus wavelength for a solar spectrum between 300 nm and 1,000 nm of wavelength. The grayscale legend at the top of the spectrum is scaled to the wavelength of the x-axis. FIG. 2 illustrates how it is possible to use the UV and near-UV portions 240 of the solar spectrum being used for power generation while using the visible portions 250 of the spectrum for lighting. That is, the transparent OPV energy harvesting device may allow for a window to let visible light into a structure while simultaneously harvesting the UV and near-UV radiation 240 for generating power. In addition, the near-IR 260 that passes through the transparent OPV device may be used for heating.

In illustrative embodiments, a transparent solar energy harvesting device may utilize solar absorbers in the near-IR portion of the solar spectrum. That is, near-IR OPV materials may be utilized to harvest the near-IR solar radiation and allow the visible portion of the solar spectrum to pass into the structure. Furthermore, In illustrative embodiments, the transparent near-IR OPV materials may also include an amount of visible light absorbing photovoltaic materials. Some of the visible radiation 150 passes through the substrate 110 as visible light, while some of the visible radiation 155 is absorbed by the narrow band of visible light absorbing photovoltaic materials.

Figure 3A:
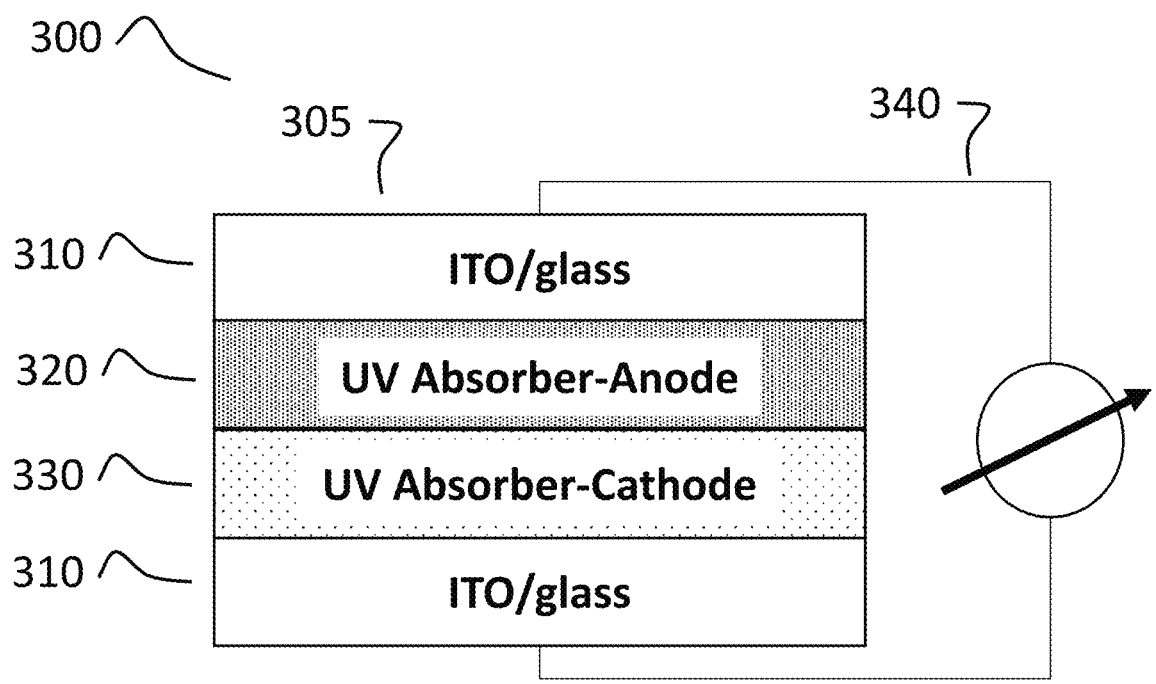
FIG. 3A schematically illustrates an organic photovoltaic device (OPV) photovoltaic device with an absorber stack and an electronic circuit in accordance with illustrative embodiments.

FIG. 3A schematically illustrates an embodiment of a OPV photovoltaic device 300 including an absorber stack 305 and an electronic circuit 340. The absorber stack includes a UV absorbing anode material 320, a UV absorbing cathode material 330, and transparent conducting electrodes of indium tin oxide (ITO) on glass. The UV absorbing anode material 320 and the UV absorbing cathode material 330 form a heterojunction with suitable energy levels to dissociate excitons into free charges that can be extracted from the device as current.

Suitable electron donor materials to be used as the UV absorbing anode material 320 include, but are not limited to, triarylamines, arylcarbazoles, fluorenes, spirofluorenes, coronenes, thiophenes, oligothiophenes, benzothiophenes, and benzodithiophenes. Specific, representative examples include, but are not limited to, TPD, NPB, m-MTDATA, TAPC, Spiro-OMeTAD, BF-DPB, BF-DPP, BF-DPN, BF-DPA, mCP, TCTA, BTE-CI, tetrabenzofuranyldibenzocoronene, and tetrabenzothiophenyldibenzocoronene.

Suitable electron acceptor materials to be used as the UV absorbing cathode material 330 include, but are not limited to, phenanthrolines, pyridinyl-containing pyrimidine molecules, benzimidazoles, quinolato aluminum complexes, triazines, oxidiazoles, arylphosphine oxides, triazoles, and fullerenes. Specific, representative examples include, but are not limited to, BPhen, B4PyMPM, TPBi, Alq3, BTB, OXD-7, DPEPO, TAZ, $C_{60}$, $C_{70}$, PCBM.

Figure 3B:
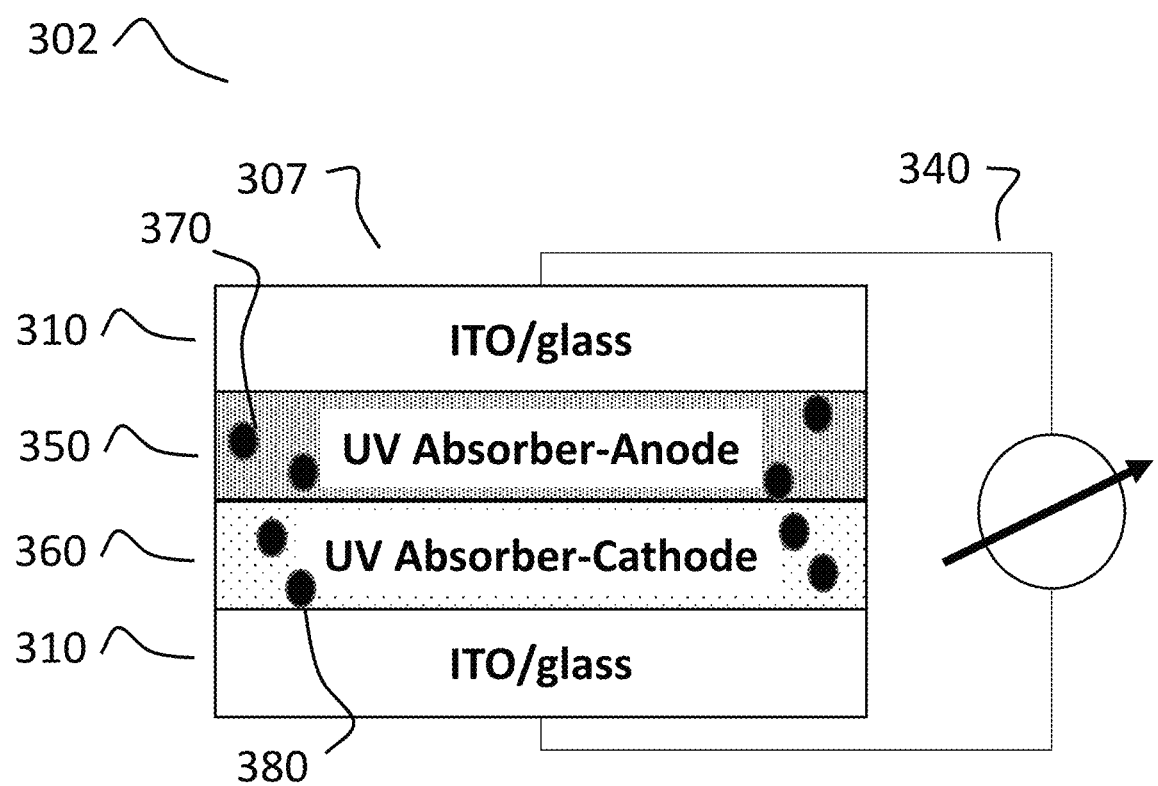
FIG. 3B schematically illustrates an OPV photovoltaic device with an absorber stack and an electronic circuit in accordance with illustrative embodiments.

FIG. 3B schematically illustrates an embodiment of an OPV photovoltaic device 302 including an absorber stack 307 and an electronic circuit 340. The absorber stack includes a UV absorbing anode material 350 that includes an amount of VIS absorbing materials 370 mixed into the UV absorbers, a UV absorbing cathode material 360 that also includes an amount of VIS absorbing materials 380 mixed into the UV absorbers, and transparent conducting electrodes of indium tin oxide (ITO) on glass. The UV absorbing anode material 350 and the UV absorbing cathode material 360 form a heterojunction with suitable energy levels to dissociate excitons into free charges that can be extracted from the device as current. Furthermore, suitable energy levels for the VIS absorbing materials dissociate excitons into free charges that can be extracted from the device as current. In this embodiment, the electrical power produced by the UV absorbing material 350,360 is supplemented by the electrical power produced by the additional band of visible light absorbing material 370,380.

Suitable electron donor materials to be used as the UV absorbing anode material 350 include, but are not limited to, triarylamines, arylcarbazoles, fluorenes, spirofluorenes, coronenes, thiophenes, oligothiophenes, benzothiophenes, and benzodithiophenes. Specific, representative examples include, but are not limited to, TPD, NPB, m-MTDATA, TAPC, Spiro-OMeTAD, BF-DPB, BF-DPP, BF-DPN, BF-DPA, mCP, TCTA, BTE-CI, tetrabenzofuranyldibenzocoronene, and tetrabenzothiophenyldibenzocoronene.

Suitable electron acceptor materials to be used as the UV absorbing cathode material 360 include, but are not limited to, phenanthrolines, pyridinyl-containing pyrimidine molecules, benzimidazoles, quinolato aluminum complexes, triazines, oxidiazoles, arylphosphine oxides, triazoles, and fullerenes. Specific, representative examples include, but are not limited to, BPhen, B4PyMPM, TPBi, Alq3, BTB, OXD-7, DPEPO, TAZ, $C_{60}$, $C_{70}$, PCBM.

Suitable organic absorber materials to be used as the VIS absorbing material 380 include, but are not limited to, coumarins, naphthalimides, coronenes, anthracenes, rubrenes, thiophenes, fluorenes, diazafluorenes, fluorenones, dicyanomethylenes, rhodamines, perylenebisimides, and bipyridines.

Figure 4:
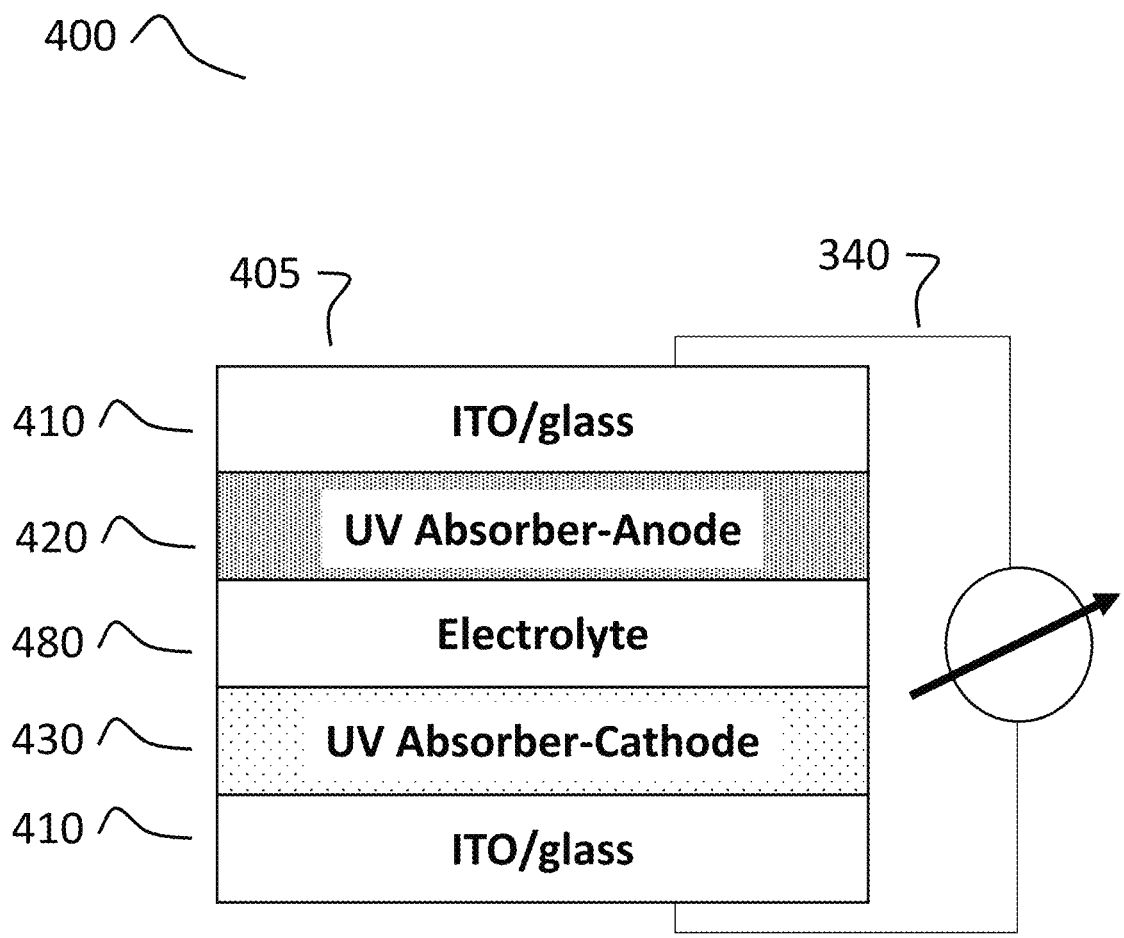
FIG. 4 schematically illustrates an OPV photovoltaic device with an absorber stack and an electronic circuit in accordance with illustrative embodiments.

FIG. 4 schematically illustrates an embodiment of a OPV photovoltaic device 400 including an absorber stack 405 and an electronic circuit 340. The absorber stack includes a UV absorbing anode material 420, a UV absorbing cathode material 430, an electrolyte material 480, and transparent conducting electrodes of indium tin oxide (ITO) 410 on glass. In this embodiment, the electrolyte material 480 provides a physical separation between the cathode 430 and anode 420 material, and provides a medium through which charge carriers may move.

Suitable electron donor materials to be used as the UV absorbing anode material 420 include, but are not limited to, triarylamines, arylcarbazoles, fluorenes, spirofluorenes, coronenes, thiophenes, oligothiophenes, benzothiophenes, and benzodithiophenes. Specific, representative examples include, but are not limited to, TPD, NPB, m-MTDATA, TAPC, Spiro-OMeTAD, BF-DPB, BF-DPP, BF-DPN, BF-DPA, mCP, TCTA, BTE-CI, tetrabenzofuranyldibenzocoronene, and tetrabenzothiophenyldibenzocoronene.

Suitable electron acceptor materials to be used as the UV absorbing cathode material 430 include, but are not limited to, phenanthrolines, pyridinyl-containing pyrimidine molecules, benzimidazoles, quinolato aluminum complexes, triazines, oxidiazoles, arylphosphine oxides, triazoles, and fullerenes. Specific, representative examples include, but are not limited to, BPhen, B4PyMPM, TPBi, Alq3, BTB, OXD-7, DPEPO, TAZ, $C_{60}$, $C_{70}$, PCBM.

Suitable an electrolyte material 480 to be used as an electrolyte in the OPV photovoltaic device 400 includes, but is not limited to, iodide/triiodide aqueous and organic solutions, iodine solutions in iodide containing ionic liquids, imidazolium iodides, iodine/iodide-doped polymer matrices such as poly(ethylene oxide), poly(N-alkyl-4-vinylpyridine)s, iodine/iodide-doped mesoporous titanium dioxide, and ionically doped triarylamine derivatives.

Figure 5:
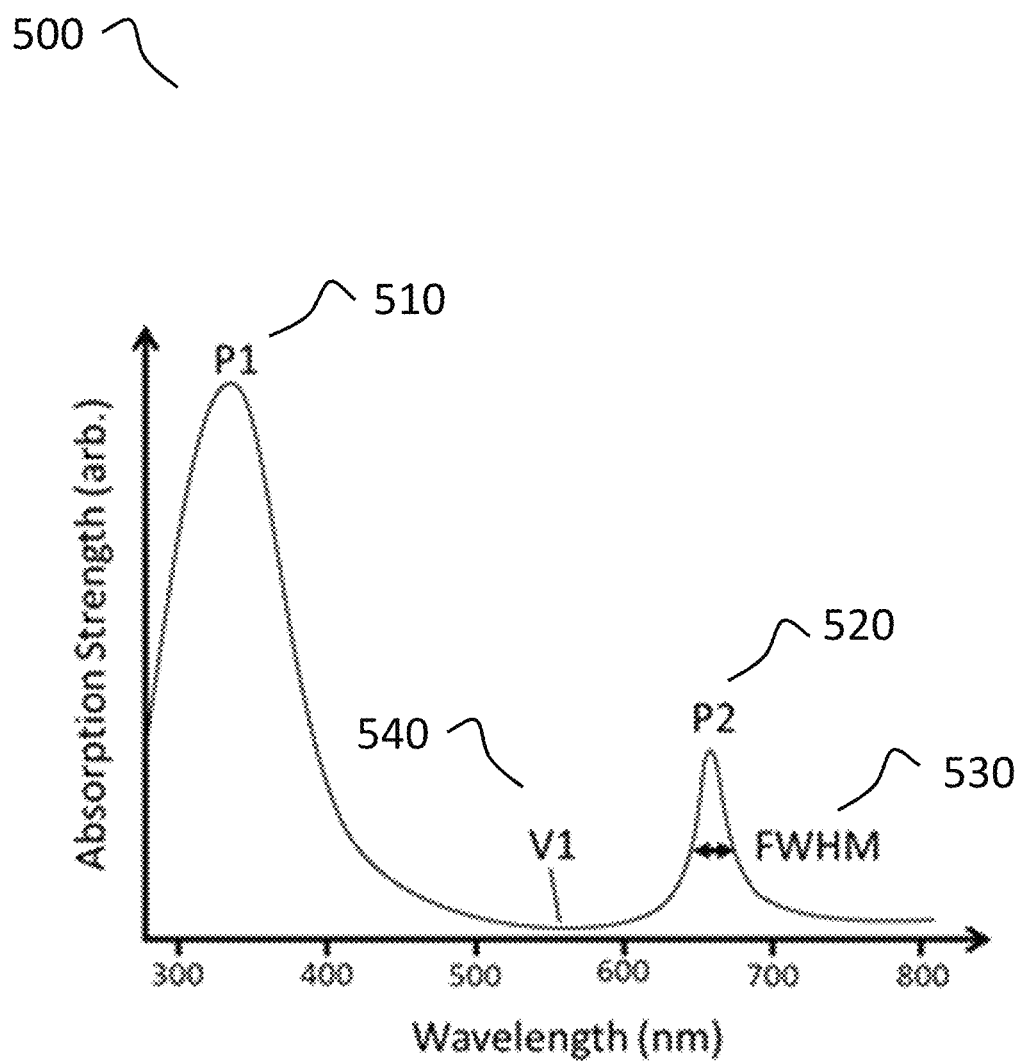
FIG. 5 graphically shows a generalized sketch of an absorption spectrum with a primary absorption and a secondary absorption peak in accordance with illustrative embodiments.

FIG. 5 schematically shows a generalized sketch of an absorption spectrum 500 with a primary absorption peak "P1" 510 that absorbs UV and near-UV light, and a secondary absorption peak "P2" 520 that absorbs a thin band of visible light. This generalized, representative spectrum could be the absorption spectrum of a single absorber, multiple absorbers, or a full stack transparent device. The visible absorption peak P2 520 has a full-width half maximum (FWHM) 530 as shown, and the two absorption features are separated by a valley with little or no absorption "V1" 540. The primary absorption peak "P1" 510 strongly absorbs ultraviolet and/or near ultraviolet light (ranging from 300 nm to 450 nm in wavelength) while the weaker secondary absorption peak "P2" 520 absorbs a band of visible wavelengths (in the range of 400 to 780 nm). This is not limited to a single secondary absorption peak "P2", as there could be two or more secondary, tertiary, etc., narrow band absorption peaks in the visible region of the spectrum. In some embodiments, these peaks may be separated by valleys, as represented by "V1" 540, which may have at least 50% weaker absorption than any of the neighboring absorption peaks, "P1", "P2", or so on. The absorption of any such visible band, such as P2, does not need to be as strong as the primary absorption feature, nor does it need to be "strong" in any absolute sense. Even a small amount of absorption, resulting in a quantum efficiency in this band of just 5% or 10% can make a meaningful impact on power generation. The potential for power generation using narrow bands of visible light is illustrated in Table 1 above.

The schematic absorption spectrum in FIG. 5 illustrates an embodiment of an OPV photovoltaic device or an LSC luminescent solar concentrator device that absorbs radiation in the UV and near-UV portion of the solar spectrum with a broad absorption band P1 510 between about 300 nm and 400 nm. FIG. 5 also illustrates that the OPV photovoltaic device is largely transparent in the VIS portion of the wavelength spectrum V1 540, but does have a narrow absorption band P2 520 at wavelengths less than 780 nm.

Figure 6A:
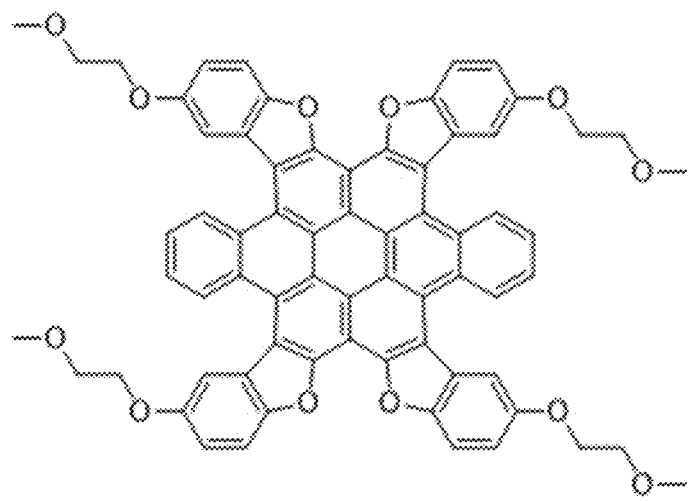
FIG. 6A presents the chemical structures of a coronene luminophore in accordance with illustrative embodiments.
Figure 6B:
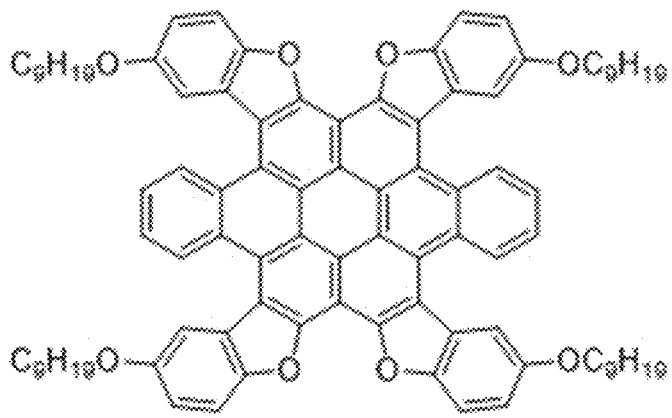
FIG. 6B presents the chemical structures of a coronene luminophore in accordance with illustrative embodiments.

FIG. 6A and FIG. 6B present the chemical structures of example coronene derivatives, namely functionalized tetrabenzofuranyldibenzocoronenes, that may be employed in a variety of the embodiments described herein. The two structures in FIG. 6A and FIG. 6B are presented as illustrative examples of single molecules that can serve in the OPV and LSC embodiments of this disclosure but are by no means intended to be limiting.

FIG. 6A is a chemical structure of tetrabenzofuranyldibenzocoronene with four-fold derivatization at the benzofuran 5-position with 2-methoxyethoxy substituents ("MOEO-TBF").

FIG. 6B is a chemical structure of tetrabenzofuranyldibenzocoronene with four-fold derivatization at the benzofuran 5-position with nonyloxy substituents.

Figure 6C:
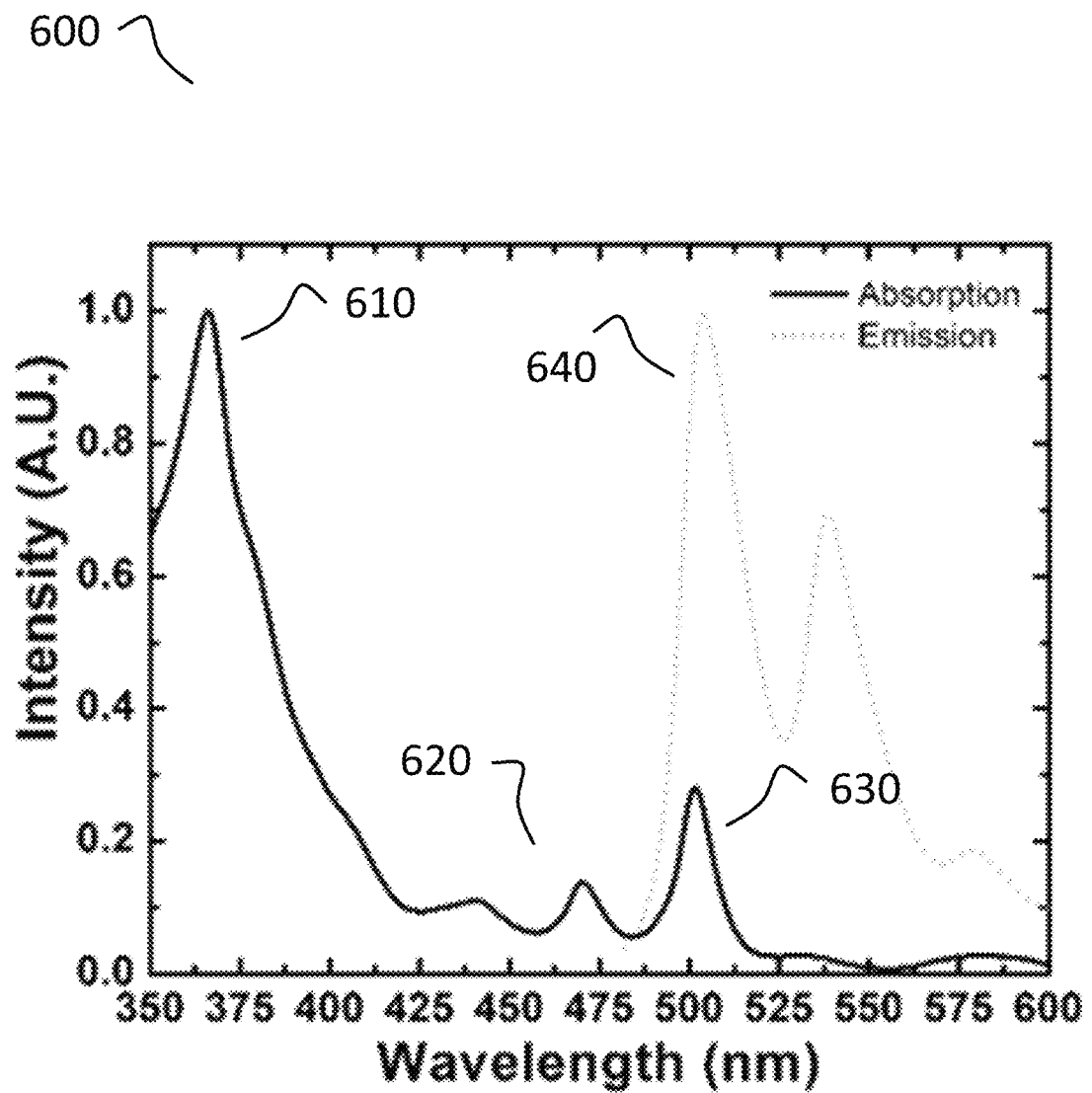
FIG. 6C graphically shows an example of absorption and emission spectra of an organic luminophore that absorbs strongly <400 nm light with a secondary absorption feature at about 500 nm in accordance with illustrative embodiments.

FIG. 6C presents absorption and emission spectra of an tetrabenzofuranyldibenzocoronene derivative embedded in a polymer host that absorbs strongly <400 nm light with an absorption band at around 365 nm 610, with a secondary absorption feature at about 500 nm 630. This coronene derivative, similar to the molecules shown in FIGS. 6A and 6B combines a strong UV absorption with a broad region of low absorption in the VIS region 620, and a narrow absorption band around 500 nm 630 portion of the solar spectrum.

In addition to the absorption spectrum, FIG. 6C also presents an emission spectrum 640 of this coronene derivative material. That is, not only does it absorb in the UV and VIS regions, but the material also emits visible light of wavelengths between about 500 nm and about 575 nm.

Figure 7:
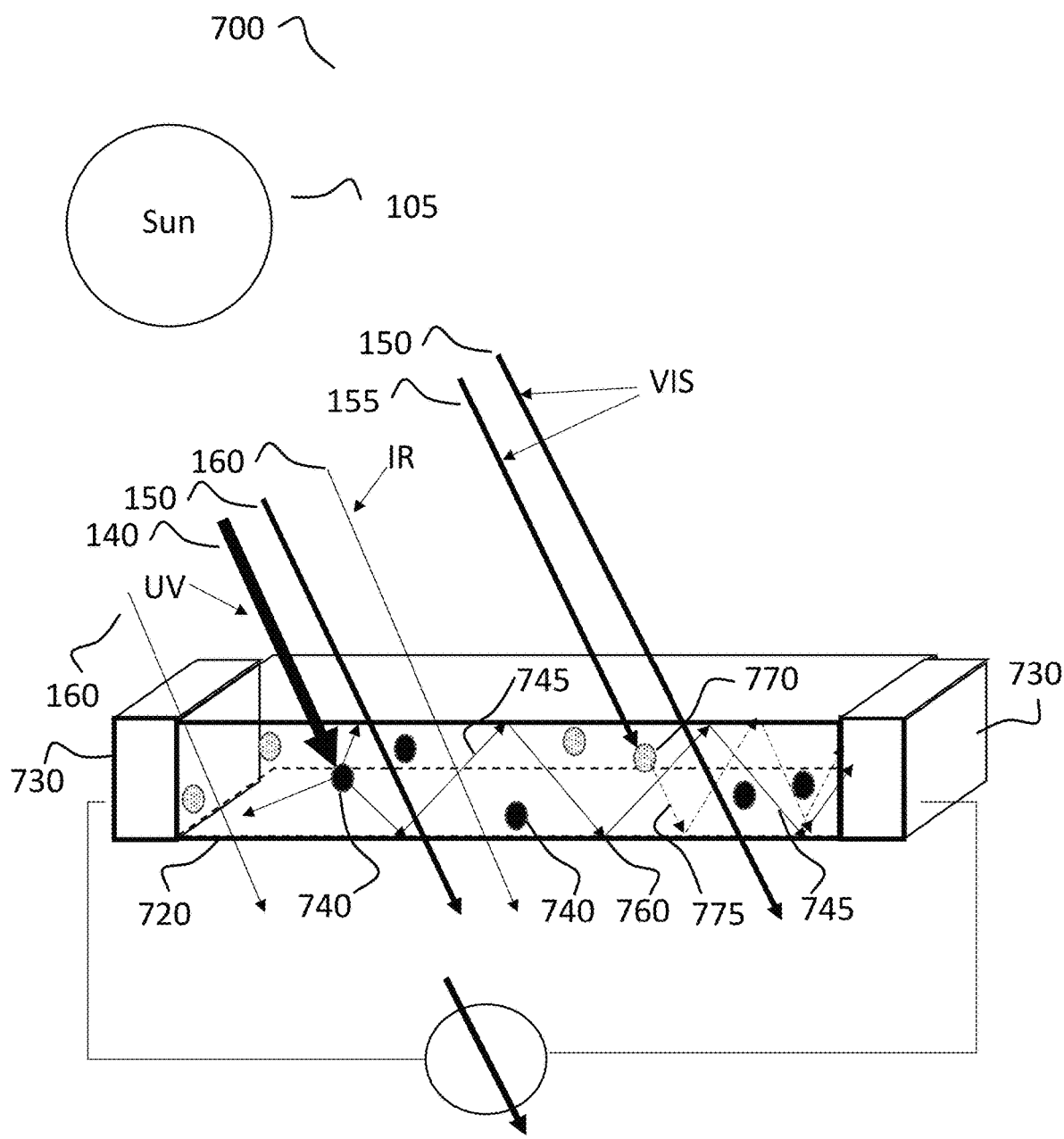
FIG. 7 schematically shows a transparent luminescent solar concentrator in accordance with illustrative embodiments.

FIG. 7 schematically shows an embodiment of a transparent luminescent solar concentrator (e.g., LSC) 700. This embodiment of a transparent LSC 700 includes a film, plexiglass, or glass substrate 720 that can act as a waveguide for absorbed radiation. The radiation may be concentrated as re-emitted light in plane, and/or harvested at a periphery (e.g., side surface, or edge) of the film, plexiglass, or glass substrate, for electricity.

A photovoltaic device 730 is positioned at a side edge of the of the LSC substrate 720 to collect radiation that is emitted from the substrate waveguide 720. The photovoltaic device 730 may be comprised of any type device that converts radiation into electrical power. Examples include, but are not limited to, thin film, single crystal, polycrystalline, amorphous photovoltaic devices, and the like. The solar materials may include, but are not limited to, silicon, CdTe (cadmium telluride), GaAs (gallium arsenide), CGIS (copper gallium indium sulfide), transparent OPV's, and the like.

In illustrative embodiments, one or more embedded luminophores that absorb and emit light during device operation may be embedded in the substrate. The embedded luminophore(s) may be, but is not limited to, one or a combination of two of more of the following: coumarins, naphthalimides, coronenes, anthracenes, rubrenes, thiophenes, fluorenes, diazafluorenes, fluorenones, dicyanomethylenes, rhodamines, perylenebisimides, and bipyridines, as the UV absorbing luminophore(s) 740 (absorbing near UV light with a peak absorption between 300 and 450 nm), which may emit photons 745 at a different wavelength than was absorbed (emitting in the visible with peak wavelengths from 400 to 780 nm). The photons 745 emitted from the UV absorbing luminophore 740 may be internally reflected 760 off of the surfaces the LSC substrate 720 and directed to the photovoltaic device 730 for conversion to electrical power.

In illustrative embodiments, embedded luminophores may be visible light absorbing luminophores 770 that absorb a narrow wavelength band of visible light. The embedded luminophore(s) may be, but is not limited to, one or a combination of two of more of the following: coumarins, naphthalimides, coronenes, anthracenes, rubrenes, thiophenes, fluorenes, diazafluorenes, fluorenones, dicyanomethylenes, rhodamines, perylenebisimides, and bipyridines. For example, an embedded luminophore may be a VIS absorbing luminophore 770 (absorbing visible light with a peak absorption between 400 and 780 nm), which may emit photons 775 at a different wavelength than was absorbed (emitting in the visible and near infrared with peak wavelengths from 400 to 1000 nm). The photons 775 emitted from the VIS absorbing luminophore 770 may be internally reflected off of the surfaces the LSC substrate 720 and directed to the photovoltaic device 730 for conversion to electrical power.

Figure 8:
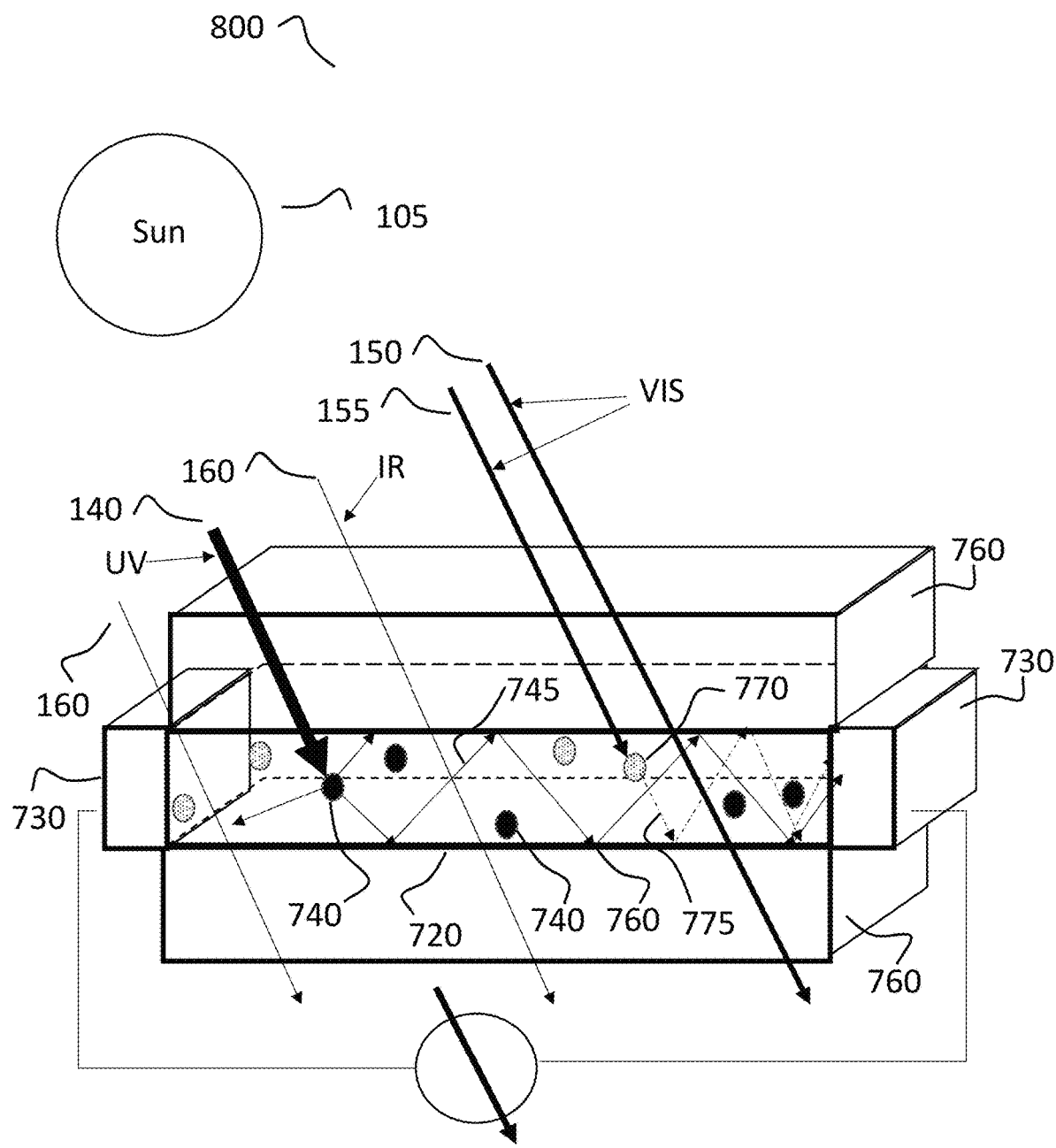
FIG. 8 schematically shows an alternative transparent luminescent solar concentrator in accordance with illustrative embodiments.

FIG. 8 schematically shows an embodiment of a transparent luminescent solar concentrator (e.g., LSC) 800 where the substrate waveguide 720 is sandwiched between two sheets of a rigid transparent material, such as glass, plastic, or plexiglass 760. In some embodiments, the substrate waveguide 720 has UV absorbing luminophores 740 and visible light absorbing luminophores 770, as described above in FIG. 7. Furthermore, the LSC 800 includes a photovoltaic device 730, as described above in FIG. 7.

In illustrative embodiments, the rigid transparent material 760 may have a thickness between 1 mm and 20 mm. Furthermore, the substrate waveguide 720 may be a flexible film, a rigid film, a rigid substrate, or the such.

Figure 9:
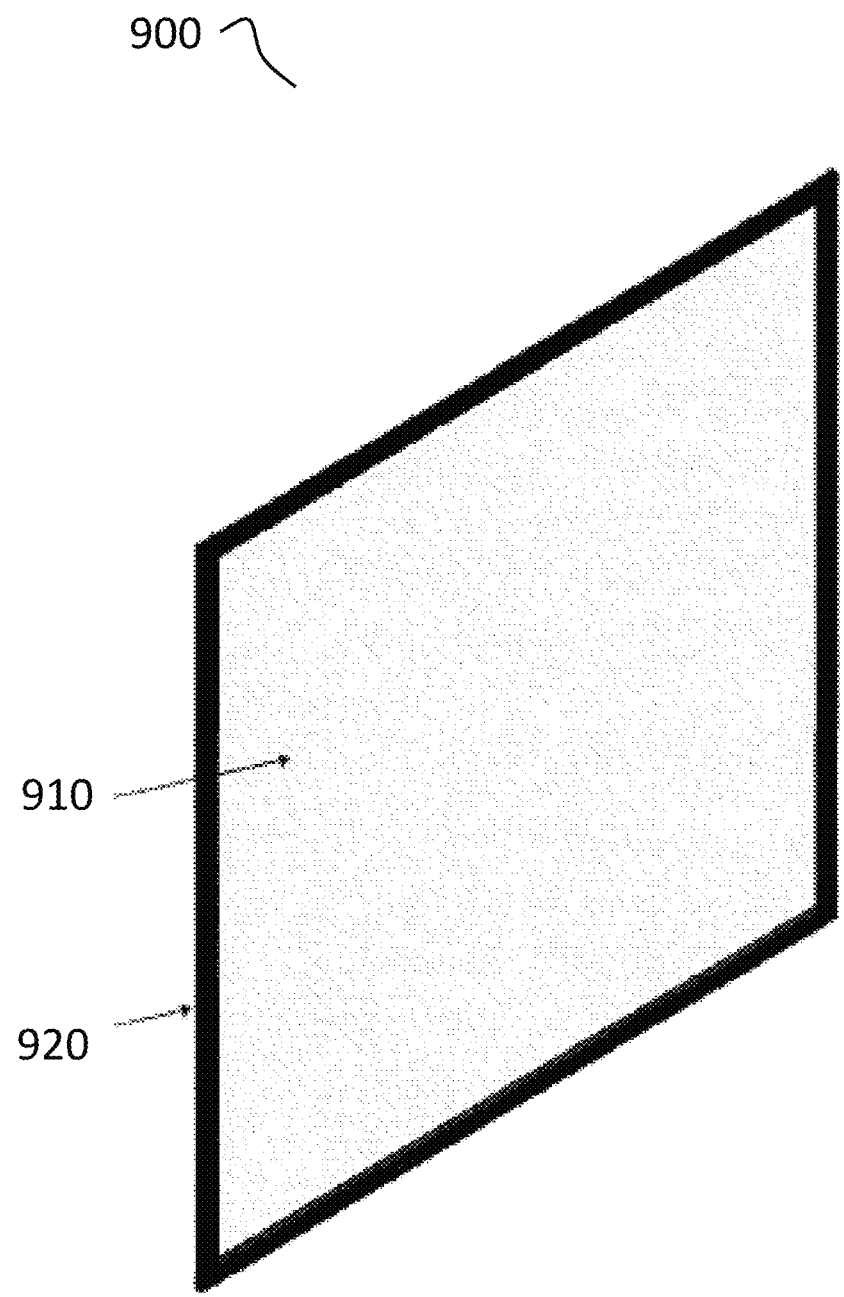
FIG. 9 schematically shows yet another alternative transparent luminescent solar concentrator in accordance with illustrative embodiments.

FIG. 9 is a perspective view of a reversibly installable smart window insert comprising one or more supplemental panes of glass, acrylic or other transparent substrates 910 with edge-mounted insulation or frame 920 such as an insulating foam, gasket, or thermal edge spacer that serves to create a thermally insulated air gap between the removable smart window insert and the permanent installed glass façade.

Figure 10:
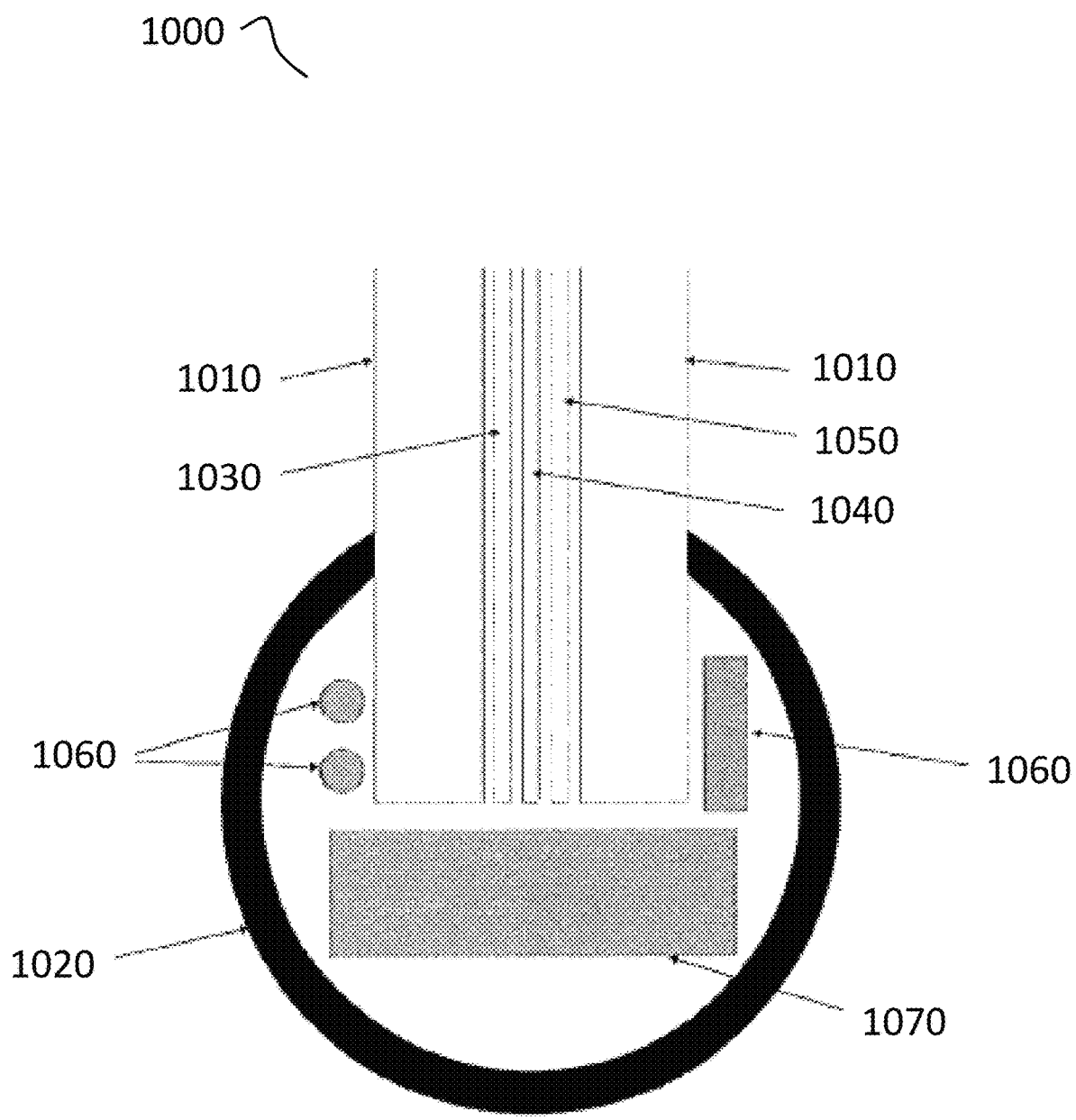
FIG. 10 schematically illustrates a cross-sectional view of a window insert in accordance with illustrative embodiments.

FIG. 10 is a cross-sectional view of a reversibly installable smart window insert 1000 comprising one or more supplemental panes glass, acrylic or other transparent substrates 1010 with edge-mounted insulation or frame 1020 such as insulating foam, gasket, or thermal edge spacer that serves to create a thermally insulated air gap between the removable smart window insert and a permanent glass façade. The ultraviolet solar layer or layers 1030 comprising either a transparent organic photovoltaic cell or cell array or a transparent luminescent solar concentrator film or energy-harvesting device is positioned closest to the permanent glass façade. The electrically-dimmable layer or layers 1040 are positioned after the ultraviolet solar layer or layers with respect to the permanent glass façade. The electrically-dimmable layers can be electrochromic films encapsulated by glass panes and laminated monolithically to the ultraviolet solar layers, or the electrically-dimmable layers 1040 can be separated from the ultraviolet solar layer or layers 1030 by an air gap. A low-emission film 1050 can be deposited or laminated monolithically as the terminating layers of the electrically-dimmable layers 1040 or deposited or laminated separately onto a glass or other transparent substrate that is positioned after the electrically-dimmable layers 1040 with respect to the permanent glass façade. The edge-mounted insulation or frame 1020 can house one or more electrical components 1060 including sensors, energy-storage elements, wireless communication elements, light sensors, color sensors, humidity sensors, temperature sensors, occupancy sensors, motion sensors, cellular signal amplifiers, universal serial bus interfaces, and wireless communication elements in electrical communication with the one or more electrical circuits. The edge-mounted insulation or frame 2 can house conventional opaque photovoltaic solar cells 1070 for collection of indirect solar illumination and/or harvesting of light emitted by the ultraviolet solar layer 2 and waveguided via one or more glass or other transparent substrates 1 to the edges of the smart window insert.

Figure 11A:
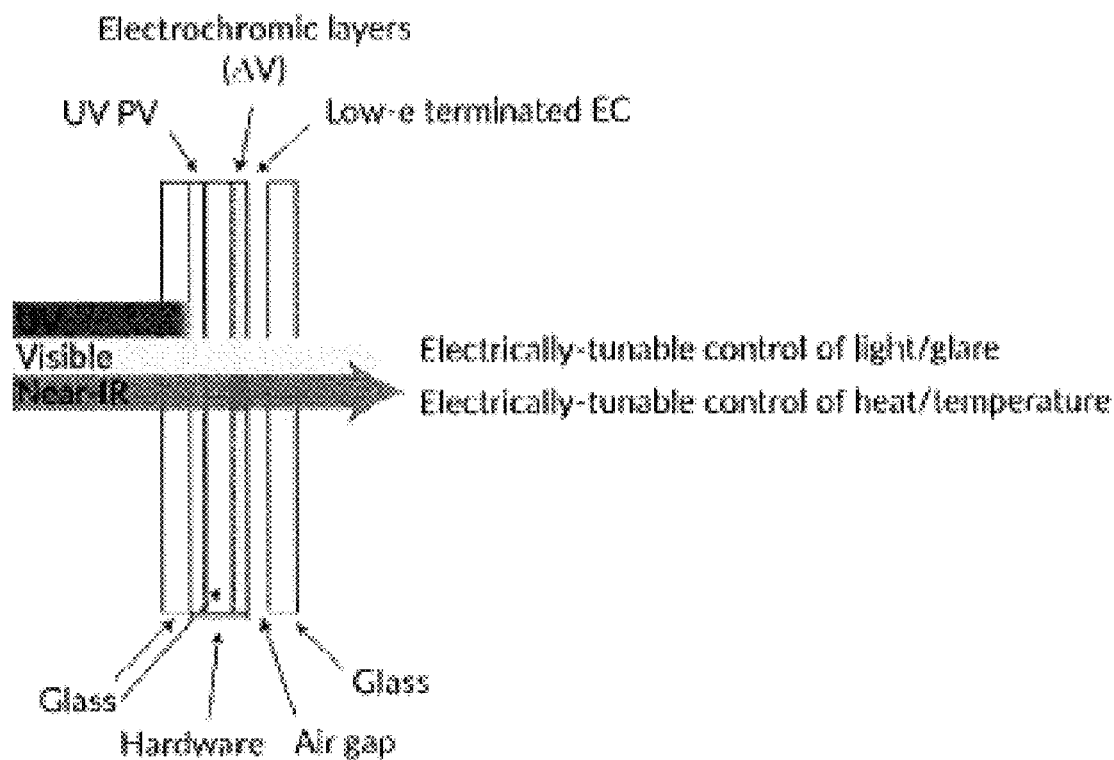
FIG. 11A schematically illustrates another cross-sectional view of window inserts and associated functional characteristics of various layers in accordance with illustrative embodiments.
Figure 11B:
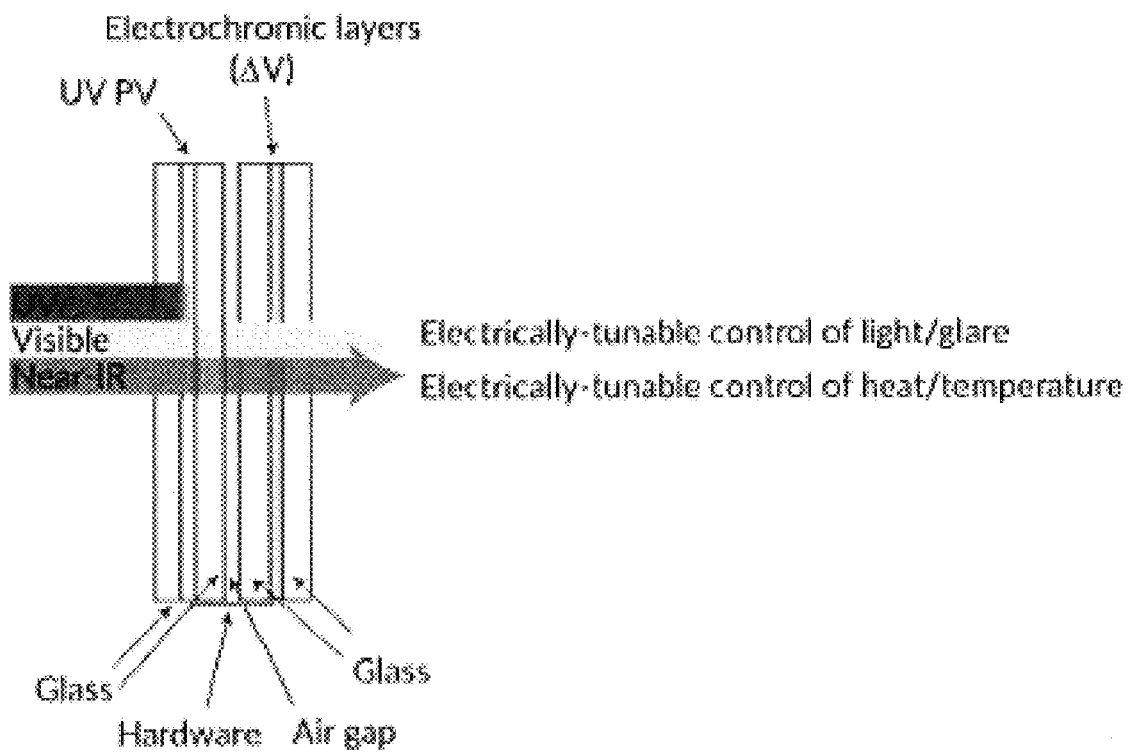
FIG. 11B schematically illustrates another cross-sectional view of window inserts and associated functional characteristics of various layers in accordance with illustrative embodiments.
Figure 11C:
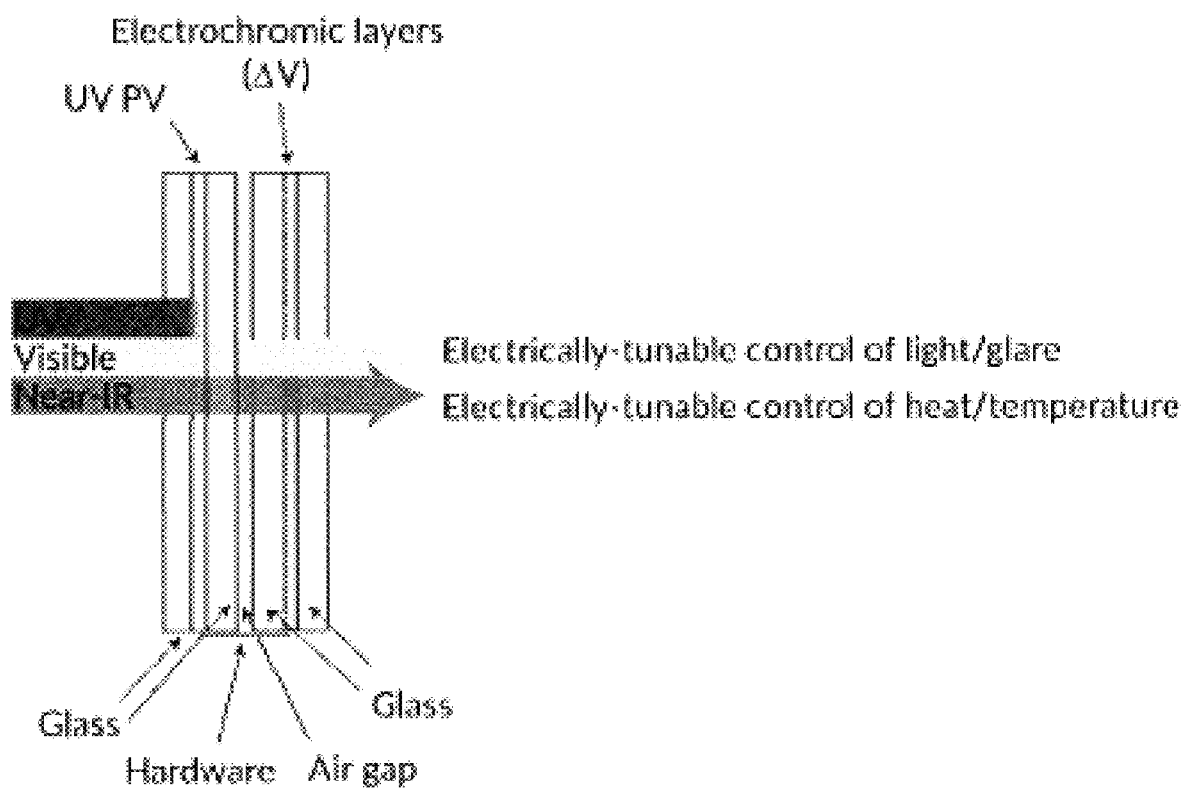
FIG. 11C schematically illustrates a yet another cross-sectional view of window inserts and associated functional characteristics of various layers in accordance with illustrative embodiments.

FIGS. 11A-11C illustrate in cross-sectional views the functions of each optically-active layer or pane in exemplary embodiments of smart window inserts having a variety of arrangements and glass or transparent substrate configurations. In all configurations an ultraviolet photovoltaic layer "UV PV" is the optically-active layer positioned nearest the permanent glass façade. The smart window insert may comprise monolithically-integrated UV PV and electrically-dimmable or electrochromic layers or panes, as seen in FIG. 11A, and the electrically-dimmable or electrochromic layers may be terminated by one or more low-emission layers. The smart window insert may comprise UV PV and electrically-dimmable or electrochromic layers or panes that are spatially separated by an air gap, as seen in FIG. 11B. The smart window insert may comprise a one-pane UV PV layer such as an acrylic sheet of thickness 1 mm to 6 mm with embedded ultraviolet-absorbing dyes that is spatially separated by an air gap from one or more electrically-dimmable or electrochromic layers or panes, as illustrated in FIG. 11C.

Figure 12:
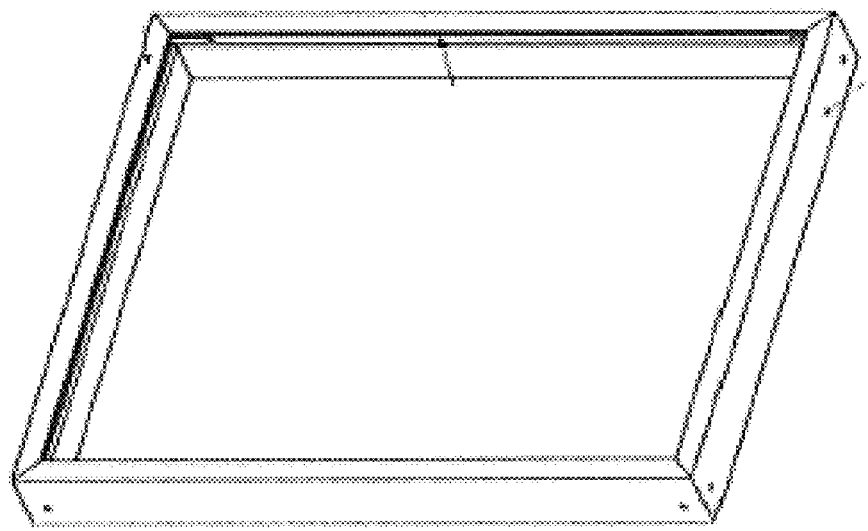
FIG. 12 schematically shows a perspective view of an edge-mounted frame for housing one or more in accordance with illustrative embodiments.

FIG. 12 is a perspective view of an edge-mounted frame for housing one or more smart insert layers that can be seated into the frame such that electrical connections can be made in and along the frame interior. The frame periphery can be augmented by insulating foam and/or bond edge spacers to create one or more thermally insulated air gaps between the permanent glass façade and the smart window insert or inserts. Hardware can be hidden from view by housing one or more electrical components in and along the frame interior. The purpose of the edge-mounted frame is to temporarily secure the smart window insert or inserts to the permanent glass façade in a removable format while providing thermal insulation between the building interior and the permanent glass façade. One or more insert layers can be seated into the insert frame such that electrical connections can be made in and along the frame interior.

Figure 13:
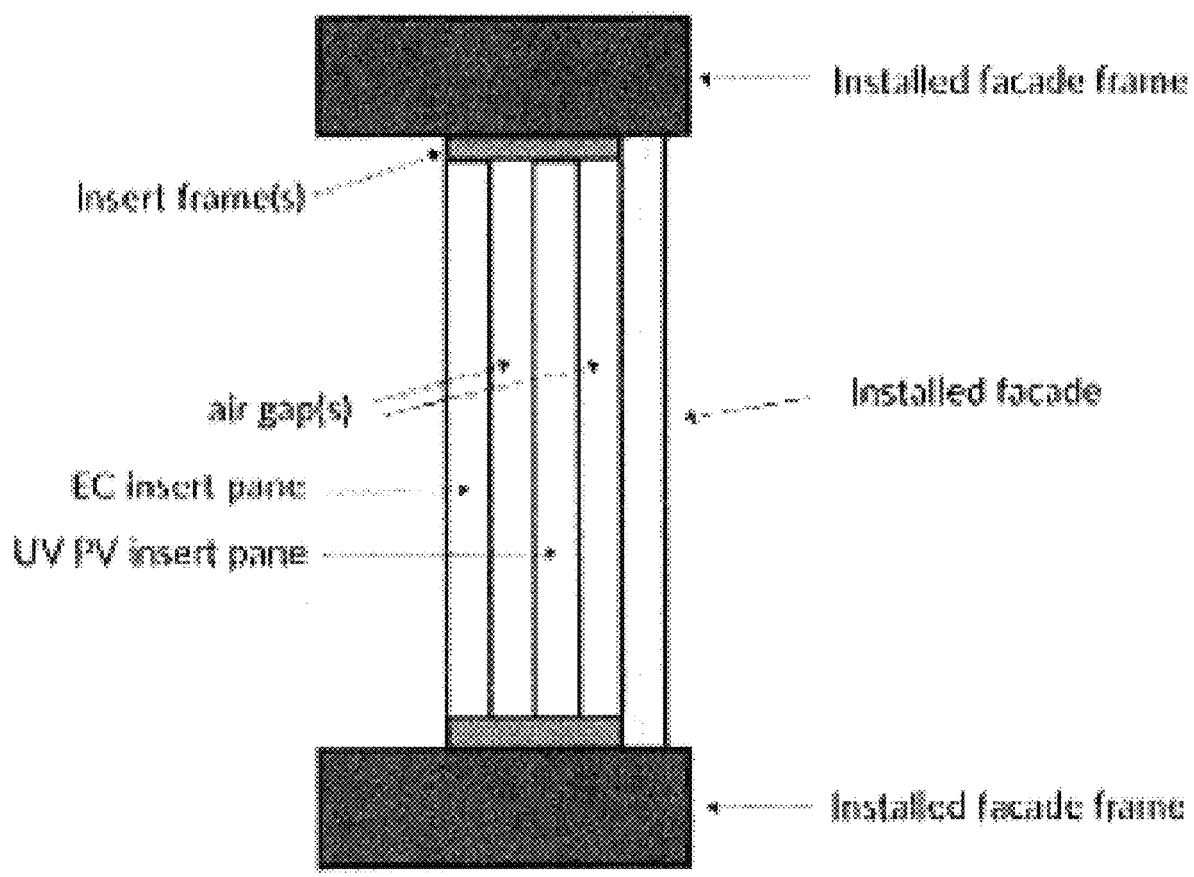
FIG. 13 schematically shows a cross-sectional view of a reversible installation of a window insert system in accordance with illustrative embodiments.

FIG. 13 is a cross-sectional view of an exemplary embodiment of a reversible installation of a smart window insert system comprising an ultraviolet photovoltaic "UV PV" pane and an electrochromic "EC" pane held by an edge-mounted frame "insert frame(s)" that fits within the installed façade frame. The smart window insert system is spatially separated by an air gap from the permanent glass façade and has the UV PV pane positioned nearest the installed glass façade. The smart window insert frame fits within the installed façade frame and is necessarily smaller dimensionally in length, width, and depth than the installed façade frame. The purpose of the smart window system is thus to harvest ultraviolet light for powering of in-window electrical components and/or electrically-dimmable layers or panes. The smart window insert system differs from prior art detailing integrated photovoltaic and electrochromic insulating glass units for new construction or building renovation that are permanently installed by a window glazier and in some cases also an electrician. The present invention can be reversibly installed and/or replaced or upgraded without necessarily requiring specialized labor including window glaziers or electricians. The present invention prolongs the life of the original building façade by enabling reversible upgrading of installed windows with supplemental panes that can be periodically maintained or replaced in a non-disruptive manner.

Figure 14:
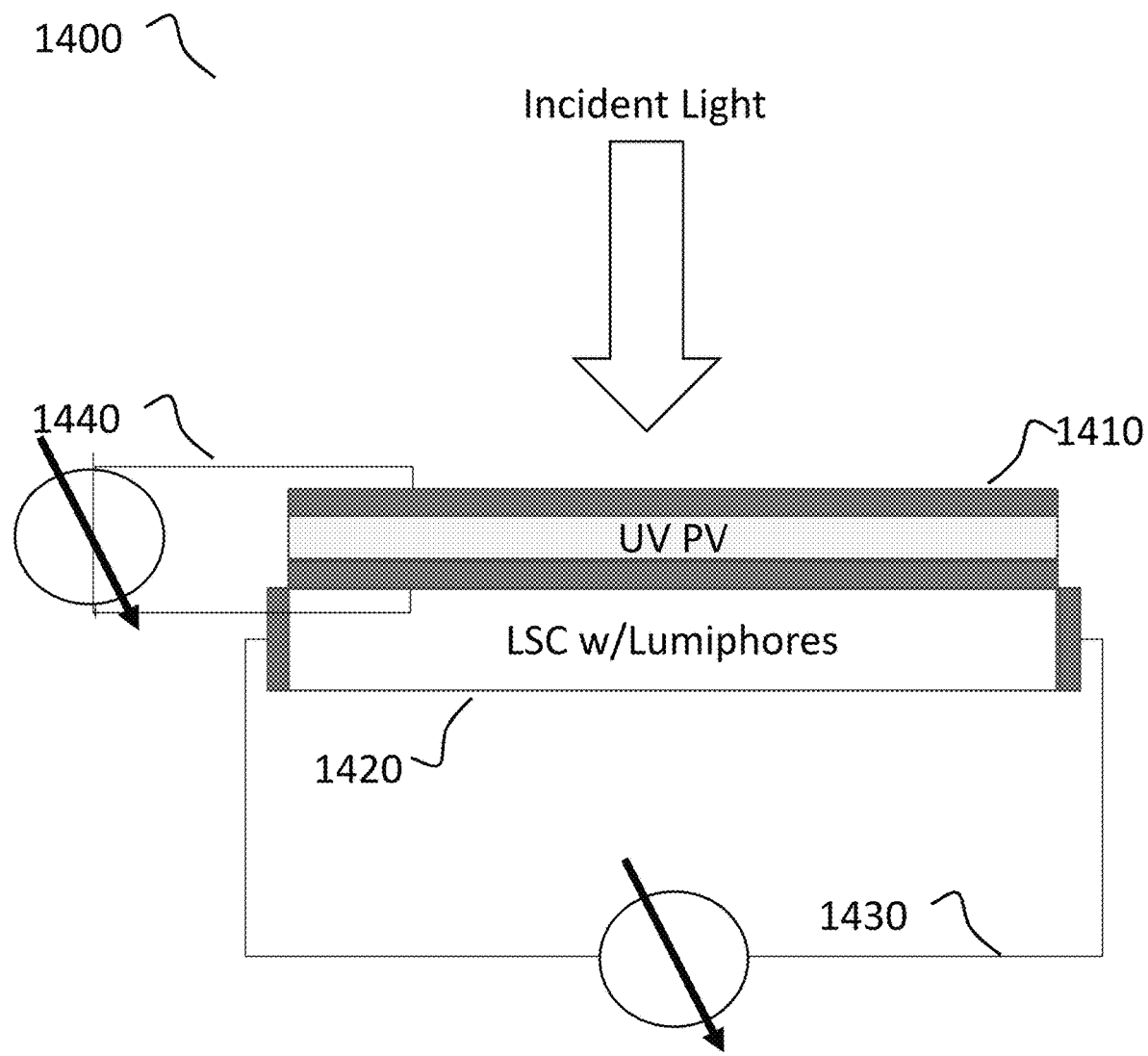
FIG. 14 schematically illustrates a device that combines a visibly transparent photovoltaic device with a visibly transparent luminescent solar concentrator in accordance with illustrative embodiments.

FIG. 14 schematically illustrates an embodiment of a device that combines a visibly transparent photovoltaic (PV) 1410 device with a visibly transparent luminescent solar concentrator (LSC) 1420 to form a combined visibly transparent LSC/PV device 1400. In this embodiment, a PV device is coupled to a top or bottom surface of an LSC, and incident light strikes the combined visibly transparent LSC/PV device.

As described above for the visibly transparent LSC, the LSC is embedded with lumiphores that absorb UV light and emit visible light. In some embodiments, some portion of the embedded luminophores absorb visible light and emit visible light. The emitted visible light from each of the luminophores is waveguided to PV cells mounted on the side surfaces and/or edges of the LSC, and is converted into electrical power in a first circuit 1430 in electrical communication with the LSC.

As described above for the visibly transparent PV device, the PV device includes a UV photosensitive material that converts UV photons into electrical energy power in a second circuit 1440 in electrical communication with the UV PC.

The first 1430 and second 1440 circuits may be combined into a single circuit at the combined visibly transparent LSC/PV device 1400, or they may be individually directed to separate electrical circuits. One or both of the first and second circuits may be in electrical communication with one or more electrical components including light sensors, color sensors, humidity sensors, temperature sensors, occupancy sensors, motion sensors, cellular signal amplifiers, universal serial bus interfaces, energy storage devices, or wireless communication elements. Furthermore, the first and/or second circuits may be connected to an electrical grid.

Figure 15:
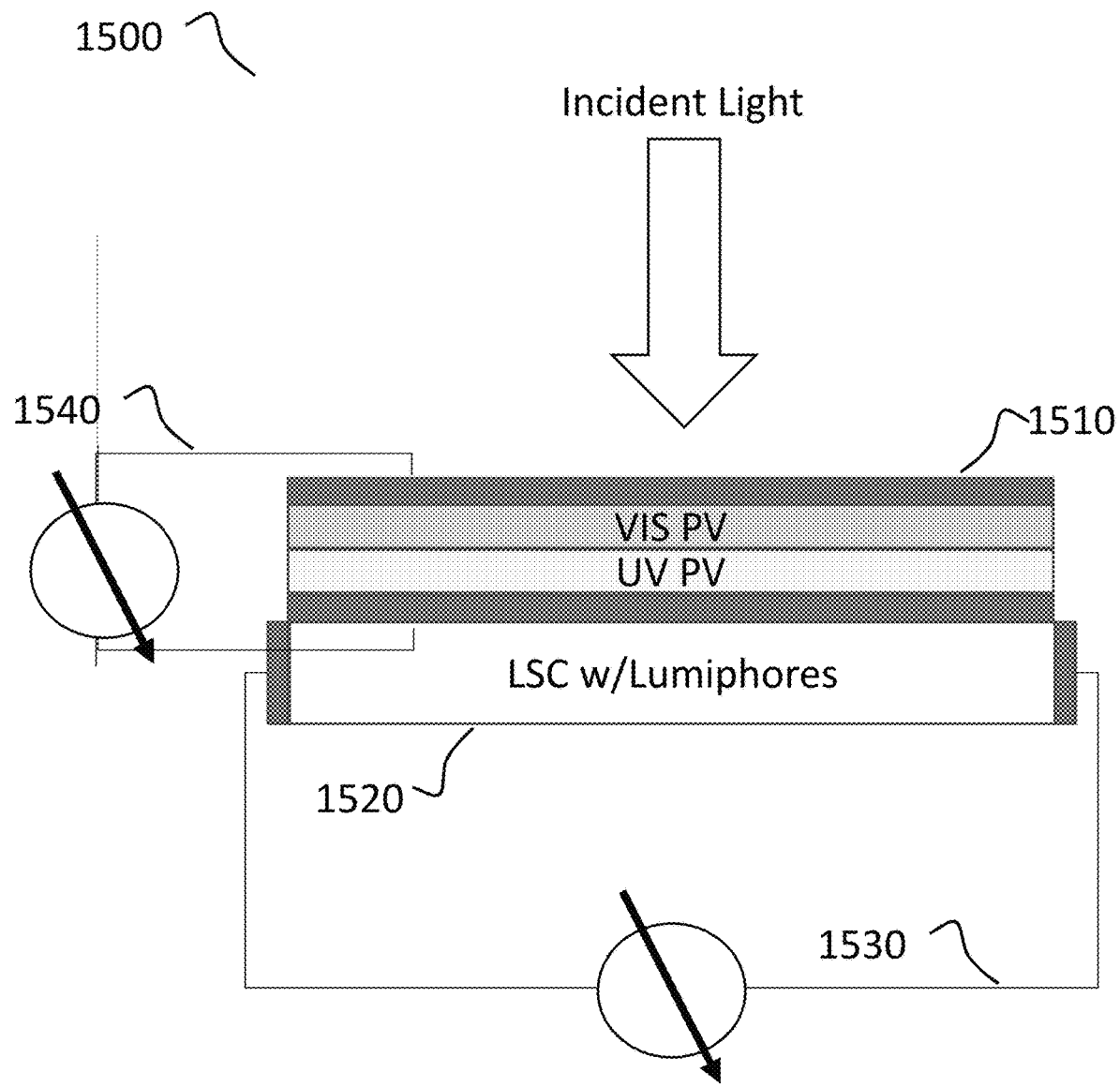
FIG. 15 schematically illustrates a device that combines a visibly transparent photovoltaic device with a visibly transparent luminescent solar concentrator in accordance with illustrative embodiments.

FIG. 15 also schematically illustrates an embodiment of a device that combines a visibly transparent photovoltaic (PV) device 1510 with a visibly transparent luminescent solar concentrator (LSC) 1520 to form a combined visibly transparent LSC/PV device 1500. The LSC 1520 is similar to the device illustrated in FIG. 14. In this embodiment, however, the PV device 1510 includes a visible light photosensitive material with the UV photosensitive material.

In illustrative embodiments, the visible light photosensitive material may be in a layer and the UV photosensitive material may be in a different layer, and they may be stacked on each other, as shown schematically on FIG. 15. Such a stack of two dissimilar materials may create a heterostructure where each material absorbs a different band of incident light (e.g., radiation). In some embodiment, the visible light photosensitive material may be mixed with the UV photosensitive material to form a mixed visible/UV photosensitive material that converts visible and UV photons into electrical energy power in a circuit in electrical communication with the PV device.

The emitted visible light from each of the luminophores is waveguided to PV cells mounted on the side surfaces and/or edges of the LSC, and is converted into electrical power in a first circuit 1530 in electrical communication with the LSC.

As described above for the visibly transparent PV device, the PV device includes a UV photosensitive material that converts UV photons into electrical energy power in a second circuit 1540 in electrical communication with the UV PC.

The first 1530 and second 1540 circuits may be combined into a single circuit at the combined visibly transparent LSC/PV device 1500, or they may be individually directed to separate electrical circuits.

Figure 16:
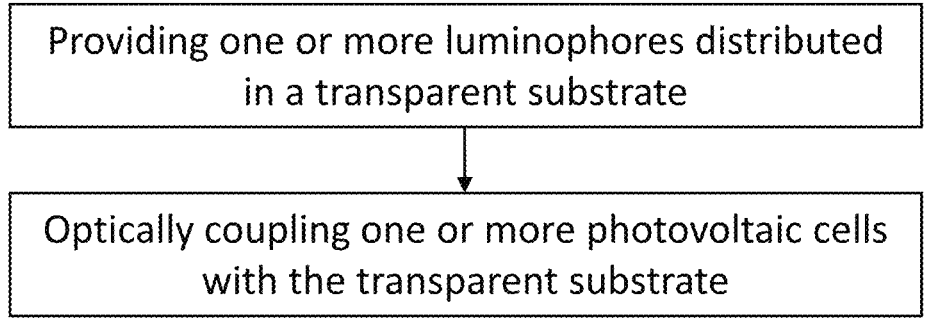
FIG. 16 shows steps of a method of making a visibly transparent luminescent solar collector in accordance with illustrative embodiments.

FIG. 16 shows steps of an embodiment of a method of making a visibly transparent luminescent solar collector (LSC). It should be noted that this method is substantially simplified from a longer process that may normally be used. Accordingly, the method shown in FIG. 16 may have many other steps that those skilled in the art likely would use. In addition, some of the steps may be performed in a different order than that shown, or at the same time. Furthermore, some of these steps may be optional in some embodiments. Accordingly, the process 1600 is merely exemplary of one process in accordance with illustrative embodiments of the invention. Those skilled in the art therefore can modify the process as appropriate.

At 1610, providing one or more luminophores distributed in a transparent substrate. The one or more luminophores are configured to absorb light in the ultraviolet (UV) region and the visible region. Furthermore, the one or more luminophores are configured to use the absorbed light in the UV region and the visible region to emit visible light in the visible region.

The providing of the one or more luminophores distributed in a transparent substrate can include dispersing the one or more luminophores in a transparent waveguide material. The providing can also include forming the transparent waveguide material with the one or more luminophores into a transparent waveguide. Furthermore, the providing can include adhering the transparent waveguide with the one or more luminophores to a transparent window material. In some embodiments, the transparent waveguide with the one or more luminophores can include a transparent film, a hard coating, or a plurality of film layers.

In some embodiments, adhering the transparent waveguide with the one or more luminophores to the transparent window material may include depositing the transparent waveguide material with the one or more luminophores to the transparent window material by thermal evaporation, solution-processing, melt-processing, organic vapor phase deposition, organic vapor jet printing, solid mixing, or crosslinking of liquid films.

At 1620, optically coupling one or more photovoltaic cells with the transparent substrate. The one or more photovoltaic cells are configured to absorb the visible light emitted by the one or more luminophores and absorb solar radiation.

The visibly transparent luminescent solar collector (LSC) absorbs visible light and solar radiation by the one or more photovoltaic cells to generate energy.

The visibly transparent LSC has an average visible transmission (AVT) of between 35% and 95% of incident light having wavelengths of between 400 nm and 780 nm. Furthermore, for the visibly transparent LSC, the absolute values of the CIE L*a*b* color coordinates a* and b* of the transmitted visible light are each between −30 and 30.

FIG. 17 shows steps of an embodiment of a method of making a window having a rigid transparent panel secured in a frame. It should be noted that this method is substantially simplified from a longer process that may normally be used. Accordingly, the method shown in FIG. 17 may have many other steps that those skilled in the art likely would use. In addition, some of the steps may be performed in a different order than that shown, or at the same time. Furthermore, some of these steps may be optional in some embodiments. Accordingly, the process 1700 is merely exemplary of one process in accordance with illustrative embodiments of the invention. Those skilled in the art therefore can modify the process as appropriate.

At 1710, provide a rigid transparent panel including a transparent film. The transparent film including a plurality of luminophores. The plurality of luminophores are operable to have a first peak absorbance of light in the ultraviolet (UV) spectrum and a peak emission of light in the visible spectrum. Furthermore, the plurality of luminophores are configured to use the absorbed light in the UV region and the visible region to emit visible light in the visible region.

The rigid transparent panel has an average visible transmission (AVT) of between 35% and 95% of incident light having wavelengths in a range of between about 400 nm and about 780 nm; and the values of the CIE L*a*b* color coordinates a* and b* of the transmitted visible light are each between negative and positive 30.

In some embodiments, the method of making a window having a rigid transparent panel secured in a frame further includes coupling an edge-mounted solar cell to an edge or a side surface of the rigid transparent panel, or coupling a solar array to the rigid transparent panel.

In some embodiments, the method of making a window having a rigid transparent panel secured in a frame further includes electrically coupling one or more electrical circuits in electrical communication with the edge-mounted solar cell or the solar array.

In some embodiments, the method of making a window having a rigid transparent panel secured in a frame further includes electrically coupling an electrically dimmable assembly regulating the transmission of visible and/or infrared electromagnetic radiation through the window in electrical communication with the one or more electrical circuits.

FIG. 18 shows steps of an embodiment of a method 1800 of making a window having a rigid transparent panel secured in a frame. It should be noted that this method is substantially simplified from a longer process that may normally be used. Accordingly, the method shown in FIG. 18 may have many other steps that those skilled in the art likely would use. In addition, some of the steps may be performed in a different order than that shown, or at the same time. Furthermore, some of these steps may be optional in some embodiments. Accordingly, the process 1800 is merely exemplary of one process in accordance with illustrative embodiments of the invention. Those skilled in the art therefore can modify the process as appropriate.

At 1810, provide at least one photosensitive layer having a first absorption peak between and including 350 nm and 420 nm and a second absorption peak between and including 420 nm and 780 nm. The second absorption peak may have a full-width half-maximum (FWHM) of between 10 nm and 75 nm. The visibly transparent photovoltaic device may have an average visible transmission (AVT) of between 35% and 95% of incident light having wavelengths of between 400 nm and 780 nm. The values of the CIE L*a*b* color coordinates a and b* of the transmitted visible light may be each between negative 30 and positive 30. The visibly transparent photovoltaic device may generate electrical power.

At 1820, provide an anode configured to be in electrical communication with a first surface of the at least one photosensitive layer. Providing the anode may include electrically coupling one or more of LiF/Al, Au, Ag, a transparent conducting oxide, a transparent conducting graphene thin film, a transparent conducting nanotube film, a transparent ultrathin metal, a metal, or metal nanowires to the first surface of the at least one photosensitive layer At 1830, provide a cathode configured to be in electrical communication with a second surface of the at least one photosensitive layer. Providing the cathode may include electrically coupling one or more of LiF/Al, Au, Ag, a transparent conducting oxide, a transparent conducting graphene thin film, a transparent conducting nanotube film, a transparent ultrathin metal, a metal, or metal nanowires to the second surface of the at least one photosensitive layer.

The at least one photosensitive layer may include an organic electron donor and an organic electron acceptor, and the photovoltaic device may include a single junction architecture generating an open circuit voltage (Voc) of at least 1.4 V.

EXAMPLES

Example 1: Coronene Extruded into PMMA as Luminescent Layer

Figure 19:
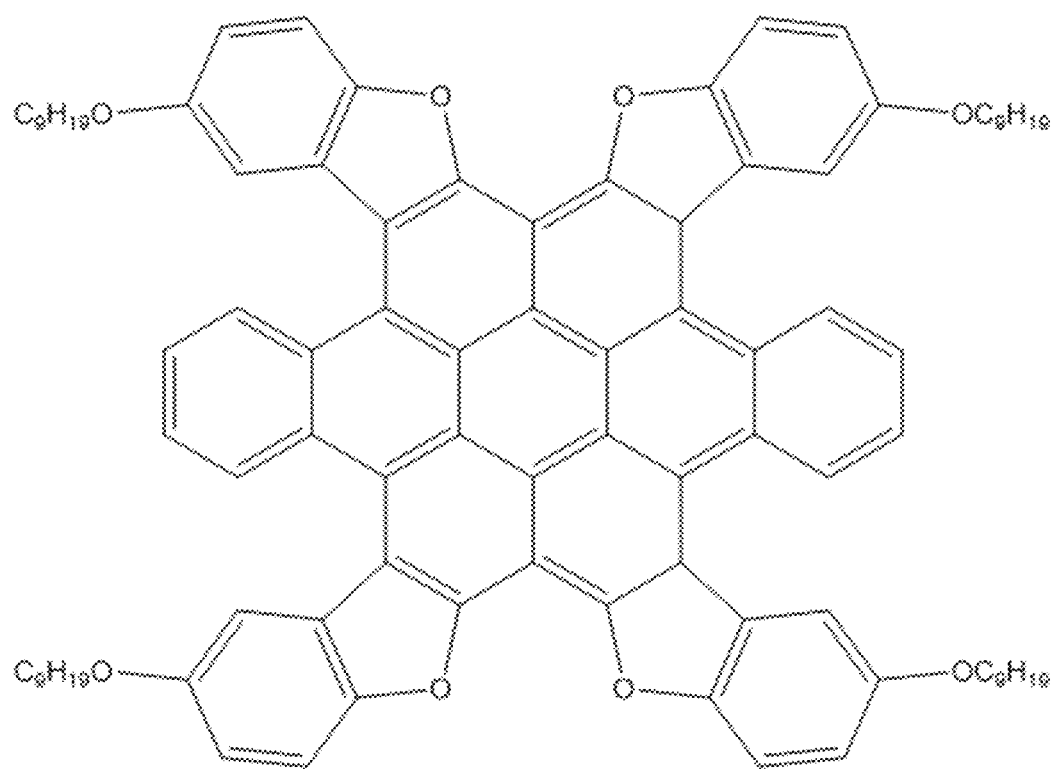
FIG. 19 shows the chemical structure of contorted 2,9,16,23-tetranonoxy-tetrabenzofuranyldibenzocoronene (UV-3) in accordance with illustrative embodiments.
Figure 20:
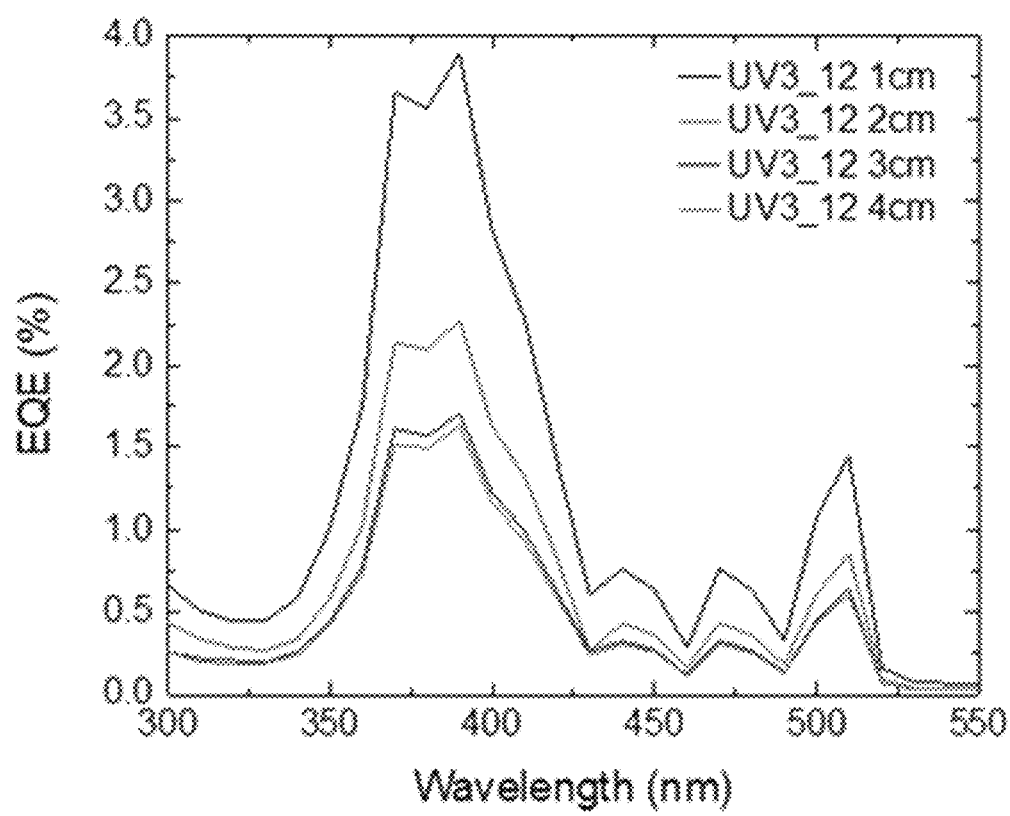
FIG. 20 graphically illustrates an example of the External Quantum Efficiency of a UV3-containing extruded film mounted to a glass plate as a function of distance in centimeters (1 to 4 cm) of the illuminated spot for the edge of the glass plate in accordance with illustrative embodiments.

A small amount of contorted 2,9,16,23-tetranonoxy-tetrabenzofuranyldibenzocoronene (UV3) was pulverized and ground into a large sample of purified polymethylmethacrylate (PMMA) powder and put through a high temperature injection molder at over 100° C. resulting in an approximately 3.0 mm thick film doped with contorted 2,9,16,23-tetranonoxy-tetrabenzofuranyldibenzocoronene (UV3) at approximately 0.00038 wt %. The structure 1900 is shown FIG. 19. This doped polymethylmethacrylate sheet had small 7 mm by 22 mm solar cells mounted to its edges to collect the waveguided light. These showed a peak external quantum efficiency (EQE) of around 4% at 395 nm, showcasing its primary near UV (NUV) absorption with a secondary, peak of 1.5% EQE at 510 nm. Both of these absorption peaks are intrinsic to the coronene doped throughout the plexiglass. This extruded sheet represents a functioning, transparent luminescent solar concentrator. FIG. 20 shows 2000 the external quantum efficiency (EQE) plot versus incident wavelength for this functioning luminescent solar concentrator.

Figure 21:
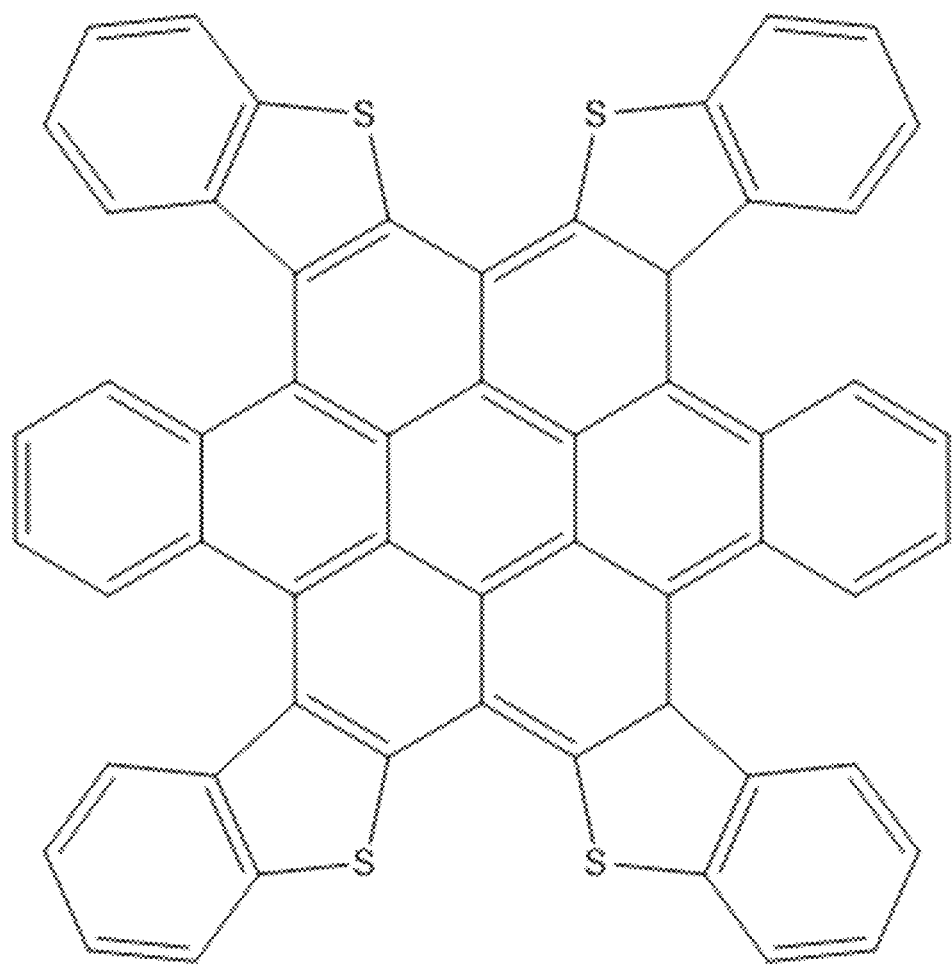
FIG. 21 shows the chemical structure of contorted tetrabenzothienodibenzocoronene (cTBTDBC) in accordance with illustrative embodiments.

Example 2: Coronene Solution Coated onto Polymer Film for Lamination Between Glass Panes 2 mg of contorted tetrabenzothienodibenzocoronene (structure 2100 shown in FIG. 21) (TBTDBC) was dissolved in 75 mL of 2-butanone with vigorous stirring to which 4 grams of cellulose acetate butyrate powder was added. The resulting solution was submicron filtered to remove suspended particles then coated by meyer rod onto a 630 micron thick polyvinylbutyrate film to form an approximately 1.5 micron thick coating. This coated polymer film was then laminated between two 4 inch by 4 inch glass panes with 80 psi of applied pressure at 70° C. for 10 minutes to yield a laminated glass to which silicon photovoltaic strips were mounted to its edges with index-matching fluid. This device was then put in a AM1.5G solar simulator for measurement and produced 0.07 W/m$^2$ of electrical power as a functioning, transparent luminescent solar concentrator device. Its average visible transmission from 400 to 780 nm was approximately 90% with its primary absorption in the ultraviolet (peaking at 380 nm) and its secondary absorption peak in the visible (peaking at 480 nm), both of these absorption features intrinsic to the coronene used.

Example 3: Mixture of Two Coumarin Dyes Solution Coated onto Polymer Film for Lamination Between Glass Panes 15 mg of 7-(ethylamino)-4,6-dimethylcoumarin, also known as Coumarin 2, and 15 mg of 3-(2-N-methylbenzimidazolyl)-7-N,N-diethylaminocoumarin, also known as Coumarin 30, were dissolved in 250 mL of 2-butanone to which 16 grams of cellulose acetate butyrate powder was added. The resultant solution was found to have a viscosity of 18 cP (centipoise) and was coated by meyer rod onto a 630 micron thick polyvinylbutyrate film and allowed to dry at room temperature resulting in a coating of approximately 1.9 microns in thickness containing the coumarin dye mixture. This coated polymer film was then laminated between two 4 inch by 4 inch glass panes with 80 psi of applied pressure at 70° C. for 10 minutes to yield a laminated glass to which silicon photovoltaic strips were mounted to its edges with index-matching fluid. This device was then put in a AM1.5G solar simulator for measurement and produced 0.20 W/m$^2$ of electrical power, suitable as a functioning, transparent luminescent solar concentrator device. Its average visible transmission from 400 to 780 nm was approximately 85% with its primary absorption in the ultraviolet (peaking at 375 nm) and its secondary absorption peak in the visible (peaking at 435 nm).

Example 4: Mixture of Two Coumarins Dyes with Acrylate Monomers Sandwiched Between Glass Panes and Photocured 2.5 mg of 7-(ethylamino)-4,6-dimethylcoumarin, also known as Coumarin 2, and 2.5 mg of 3-(2-N-methylbenzimidazolyl)-7-N,N-diethylaminocoumarin, also known as Coumarin 30, were dissolved in 52 grams of a neat acrylate monomer and then 1 mg of photoinitiator was added. After stirring this liquid mixture was spread out by spatula then pressed between two 4 inch by 4 inch glass panes and photocured with an intense UVA lamp for 5 seconds. This yielded a laminated glass to which silicon photovoltaic strips were mounted to its edges with index-matching fluid. This device was then put in a AM1.5G solar simulator for measurement and produced 0.31 W/m$^2$ of electrical power, suitable as a functioning, transparent luminescent solar concentrator device. Its average visible transmission from 400 to 780 nm was approximately 90% with its primary absorption in the ultraviolet (peaking at 375 nm) and its secondary absorption peak in the visible (peaking at 435 nm).

Example 5. A Coronene-Containing Planar Heterojunction-Based Transparent Organic Photovoltaic Device nm of Molybdenum (VI) oxide (MoO3, 99.97% from Sigma-Aldrich), 23 nm of contorted tetrabenzothienodibenzocoronene (cTBTDBC), 17 nm of contorted 1,3,6,8,13,15,18,20-octachlorohexabenzocoronene (8Cl-cHBC), and 5 nm of bathocuproine (BCP, 99.99% from Sigma-Aldrich) were sequentially evaporated at 2 Angstroms/second onto prepatterned ITO glass at a base pressure of 1×10−6 torr. Then 50 nm of aluminum was thermally evaporated through patterned masks to define the active area. The active layer was found to have an average visible transmission of over 75%, with a primary absorption peak at 400 nm, and a secondary, visible absorption peak at 530 nm.

Example 6. A Transparent Organic Photovoltaic Device with a Blended Heterojunction and a Secondary Visible Absorber in the Anode Buffer Layer First, 10 nm of 1:1 molar lithium-doped 4,7-diphenyl-1,10-phenanthroline (BPhen) was thermally evaporated onto pre-patterned and cleaned indium tin oxide (ITO) coated glass substrates. Next 120 nm of a 1:1 blend of near-ultraviolet-absorbing N4,N4'-bis(9,9-dimethyl-9H-fluoren-2-yl)-N4,N4'-diphenylbiphenyl-4,4'-diamine (BF-DPB) and 4,6-bis(3,5-di(pyridin-4-yl)phenyl)-2-methylpyrimidine (B4PymPm) was thermally evaporated on top. Then 11 nm of 10:1 molar N4,N4'-Bis(9,9-dimethyl-9H-fluoren-2-yl)-N4,N4'-diphenylbiphenyl-4,4'-diamine (BF-DPB) to visibly-absorbing 1,3,4,5,7,8-hexafluorotetracyanonaphthoquinodimethane ($F_6$-TCNNQ) was thermally evaporated on top. Then 30 nm of molybdenum (VI) oxide (MoO$_3$) was thermally evaporated on top before sputtering of indium tin oxide (ITO) at 0.1 Angstrom per second. Lastly, this stack was completed by deposition of a 50 nm layer of 1,3,5-tris(1-phenyl-1H-benzimidazol-2-yl)benzene (TPBi) thermally evaporated on top as an outcoupling layer. This transparent organic photovoltaic device had an open-circuit voltage of 1.98 Volts and an average visible transmission of 81%.

Example 7. A Coumarin Containing Film Laminated Between Two Glass Panes Installed into an Insulated Glass Unit (IGU) and Mounted in a Frame as an Energy-Harvesting Window A 1.5 micron thick cellulose acetate butyrate coating containing 1.3 weight percent (dry weight) of a 1:1 mixture of 7-(ethylamino)-4,6-dimethylcoumarin and 3-(2-N-methylbenzimidazolyl)-7-N,N-diethylaminocoumarin was gravure-coated onto a 14 inch wide, 630 micron thick polyvinylbutyrate film in a roll-to-roll coating machine. This coated film was pinch-roll-laminated between two 12 inch by 12 inch glass panels to form a glass laminate with the excess film cut off afterwards. This laminate had silicon photovoltaic cell strips optically mounted to its edges with ultraviolet-transparent adhesive with connecting wires from these strips mounted in series to produce approximately 2.2 V of output current under AM1.5G solar illumination. These photovoltaic strips were then coated in a protective sealant with the output wire leads. This sealed laminate was then mounted with an inert-gas-filled stack and back pane of glass to form an insulating glass unit (IGU). This IGU had an electronics board and battery pack mounted with the IGU in a plastic window frame to assemble a complete, functioning, luminescent solar concentrator energy-harvesting window capable of producing nearly 1 W/m$^2$ of electrical power in bright sunlight.

The embodiments of the invention described above are intended to be merely exemplary; numerous variations and modifications will be apparent to those skilled in the art. Such variations and modifications are intended to be within the scope of the present invention as defined by any of the appended claims.

What is claimed is:
1. A visibly transparent photovoltaic device, comprising:
at least one photosensitive layer having a first absorption peak between and including 350 nm and 420 nm and a second absorption peak between and including 420 nm and 780 nm;

an anode, the anode configured to be in electrical communication with a first surface of the at least one photosensitive layer; and a cathode, the cathode configured to be in electrical communication with a second surface of the at least one photosensitive layer, wherein:

the at least one photosensitive layer comprises:
a first photosensitive layer comprising an organic electron donor; and
a second photosensitive layer comprising an organic electron acceptor, wherein the first photosensitive layer and the second photosensitive layer form in a bilayer, planar heterojunction;

the first photosensitive layer has the first absorption peak between 350 nm and 420 nm; and
the second photosensitive layer has the second absorption peak between 420 nm and 780 nm; or
the first photosensitive layer has the second absorption peak between 420 nm and 780 nm; and
the second photosensitive layer has the first absorption peak between 350 nm and 420 nm;
the second absorption peak between 420 nm and 780 nm is due to the at least one photosensitive layer comprising one or more of: coumarins; naphthalimides; coronenes; anthracenes; rubrenes; thiophenes; fluorenes; diazafluorenes; fluorenones; dicyanomethylenes; rhodamines, perylenebisimides; or bipyridines;
the visibly transparent photovoltaic device has an average visible transmission (AVT) of between 35% and 95% of incident light having wavelengths of between 400 nm and 780 nm;
values of CIE L*a*b* color coordinates a* and b* of the transmitted visible light are each between negative 30 and positive 30; and
the visibly transparent photovoltaic device generates electrical power.

2. The photovoltaic device of claim 1, wherein the second absorption peak has a full-width half-maximum of between 10 nm and 75 nm.

3. The photovoltaic device of claim 1, wherein the anode and the cathode independently comprise one or more of LiF/Al, Au, Ag, a transparent conducting oxide, a transparent conducting graphene film, a transparent conducting nanotube film, a transparent metal, a metal, or metal nanowires.

4. The transparent photovoltaic device of claim 3, wherein:
the transparent conducting oxide comprises indium tin oxide (ITO), aluminum doped zinc oxide (AZO), zinc oxide, or gallium Zinc oxide (GZO);
the transparent metal comprises Al, Au, Ag, Mo, or Ni;
the metal comprises Al, Au, Ag, Ni, Cu, or Mo; and
the metal nanowires comprise Al, Au, or Ag.

5. The photovoltaic device of claim 1, wherein:
the at least one photosensitive layer comprises an organic electron donor and an organic electron acceptor; and
the photovoltaic device comprises a single junction architecture generating an open circuit voltage (Voc) of at least 1.4 V.

6. The photovoltaic device of claim 1, wherein the organic electron donor and/or the organic electron acceptor comprise dibenzocoronene derivatives.

7. The transparent photovoltaic device of claim 1, wherein:
the organic electron donor comprises a first contorted hexabenzocoronene (cHBC) or cHBC derivative; and
the electron acceptor comprises a second cHBC or cHBC derivative.

8. The photovoltaic device of claim 5, wherein the organic electron donor and the organic electron acceptor comprise at least one of a tetrabenzothiophenyldibenzocoronene derivative or a tetrabenzofuranyldibenzocoronene derivative.

9. The photovoltaic device of claim 1, further comprising:
one or more electrical components selected from the group consisting of light sensors, color sensors, humidity sensors, temperature sensors, occupancy sensors, motion sensors, cellular signal amplifiers, universal serial bus interfaces, energy storage devices, and wireless communication elements.

10. The photovoltaic device of claim 9, wherein the one or more electrical components are electrically powered by the photovoltaic device.

11. The photovoltaic device of claim 1, wherein the presence of the second peak absorption in the visible portion of the solar spectrum provides supplemental electrical power to the photovoltaic device to supplement the electrical power produced by the first peak absorption in the UV portion of the solar spectrum while maintaining the AVT above 35% and maintaining the values of the CIE L*a*b* color coordinates from a* and b* of the transmitted visible light being each between negative 30 and positive 30.

12. The photovoltaic device of claim 1, further comprising:
a transparent luminescent solar concentrator (LSC) coupled to the visibly transparent photovoltaic device, wherein the transparent LSC is coupled to the anode or the cathode.

13. A method of making visibly transparent photovoltaic device, comprising:
providing at least one photosensitive layer having a first absorption peak between and including 350 nm and 420 nm and a second absorption peak between and including 420 nm and 780 nm;
providing an anode configured to be in electrical communication with a first surface of the at least one photosensitive layer; and
providing a cathode configured to be in electrical communication with a second surface of the at least one photosensitive layer, wherein:
the at least one photosensitive layer comprises:
a first photosensitive layer comprising an organic electron donor; and
a second photosensitive layer comprising an organic electron acceptor, wherein the first photosensitive layer and the second photosensitive layer form in a bilayer, planar heterojunction;
the first photosensitive layer has the first absorption peak between 350 nm and 420 nm; and
the second photosensitive layer has the second absorption peak between 420 nm and 780 nm; or
the first photosensitive layer has the second absorption peak between 420 nm and 780 nm; and
the second photosensitive layer has the first absorption peak between 350 nm and 420 nm; the second absorption peak between 420 nm and 780 nm is due to dopants dispersed in the at least one photosensitive layer, the dopants comprise one or more of: coumarins; naphthalimides; coronenes; anthracenes; rubrenes; thiophenes; fluorenes; diazafluorenes; fluorenones; dicyanomethylenes; rhodamines, perylenebisimides; or bipyridines;

the visibly transparent photovoltaic device has an average visible transmission (AVT) of between 35% and 95% of incident light having wavelengths of between 400 nm and 780 nm;

values of CIE L*a*b* color coordinates a* and b* of the transmitted visible light are each between negative 30 and positive 30; and the visibly transparent photovoltaic device generates electrical power.

14. The method of claim 13, wherein the second absorption peak has a full-width half-maximum of between 10 nm and 75 nm.

15. The method of claim 13, wherein:

providing the anode comprises electrically coupling one or more of LiF/Al, Au, Ag, a transparent conducting oxide, a transparent conducting graphene film, a transparent conducting nanotube film, a transparent metal, a metal, or metal nanowires to the first surface of the at least one photosensitive layer; and providing the cathode comprises electrically coupling one or more of LiF/Al, Au, Ag, a transparent conducting oxide, a transparent conducting graphene film, a transparent conducting nanotube film, a transparent metal, a metal, or metal nanowires to the second surface of the at least one photosensitive layer.

16. The method of claim 13, wherein:

the at least one photosensitive layer comprises an organic electron donor and an organic electron acceptor; and the photovoltaic device comprises a single junction architecture generating an open circuit voltage (Voc) of at least 1.4 V.

17. The method of claim 13, wherein the at least one photosensitive layer comprises:

a first photosensitive layer comprising an organic electron donor; and a second photosensitive layer comprising an organic electron acceptor, wherein the first photosensitive layer and the second photosensitive layer form in a bilayer, planar heterojunction.

* * * * *